US012310191B2

(12) United States Patent
Nakanishi et al.

(10) Patent No.: US 12,310,191 B2
(45) Date of Patent: May 20, 2025

(54) DISPLAY DEVICE AND MANUFACTURING METHOD FOR DISPLAY DEVICE

(71) Applicant: SHARP KABUSHIKI KAISHA, Sakai (JP)

(72) Inventors: Youhei Nakanishi, Sakai (JP); Masayuki Kanehiro, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 771 days.

(21) Appl. No.: 17/634,920

(22) PCT Filed: Sep. 19, 2019

(86) PCT No.: PCT/JP2019/036752
§ 371 (c)(1),
(2) Date: Feb. 11, 2022

(87) PCT Pub. No.: WO2021/053788
PCT Pub. Date: Mar. 25, 2021

(65) Prior Publication Data
US 2022/0278189 A1 Sep. 1, 2022

(51) Int. Cl.
*H10K 59/131* (2023.01)
*H10K 50/115* (2023.01)
(Continued)

(52) U.S. Cl.
CPC ......... *H10K 59/131* (2023.02); *H10K 50/824* (2023.02); *H10K 50/828* (2023.02);
(Continued)

(58) Field of Classification Search
CPC .......... H10K 59/131; H10K 59/80522; H05B 33/12; H05B 33/10; H05B 33/28; G09F 9/28
See application file for complete search history.

(56) References Cited

U.S. PATENT DOCUMENTS 10,319,797 B2 * 6/2019 Kim .................. H10K 59/8731
10,347,853 B2 * 7/2019 Park ...................... G06F 3/0446
(Continued)

FOREIGN PATENT DOCUMENTS

JP 2011-029037 A 2/2011

*Primary Examiner* — Mounir S Amer
(74) *Attorney, Agent, or Firm* — ScienBiziP, P.C.

(57) ABSTRACT

A display device includes: a display region, a frame region, a thin-film transistor layer, and a light emitter layer including a plurality of light emitters each having a first electrode, a light-emitting layer, and a second electrode. The plurality of light emitters emits mutually different colors of light. The second electrode is shared among the plurality of light emitters and contains a metal nanowire. The frame region includes a bank having a frame shape surrounding the display region and defining an end of the second electrode. A conductive film is disposed closer to the display region than the bank is, the conductive film electrically connecting together the terminal section and the second electrode. The conductive film includes a contact portion being in contact with the metal nanowire. The contact portion has a plurality of asperities disposed on a contact surface being in contact with the metal nanowire.

20 Claims, 17 Drawing Sheets

(51) Int. Cl.
*H10K 50/824* (2023.01)
*H10K 50/828* (2023.01)
*H10K 59/12* (2023.01)
*H10K 59/35* (2023.01)
*H10K 59/80* (2023.01)
*H10K 71/00* (2023.01)
*H10K 102/00* (2023.01)

(52) U.S. Cl.
CPC ... *H10K 59/1315* (2023.02); *H10K 59/80524* (2023.02); *H10K 50/115* (2023.02); *H10K 59/1201* (2023.02); *H10K 59/35* (2023.02); *H10K 59/80522* (2023.02); *H10K 71/00* (2023.02); *H10K 2102/351* (2023.02)

(56) References Cited

U.S. PATENT DOCUMENTS

| | | | |
|---|---|---|---|
| 11,758,772 B2* | 9/2023 | Jeon | H10K 59/873 |
| | | | 257/88 |
| 12,101,955 B2* | 9/2024 | Shim | H10K 59/1315 |
| 12,185,576 B2* | 12/2024 | Jung | H10K 59/124 |
| 2021/0175292 A1* | 6/2021 | Bang | G06F 3/0416 |

* cited by examiner

FIG.4
(a)
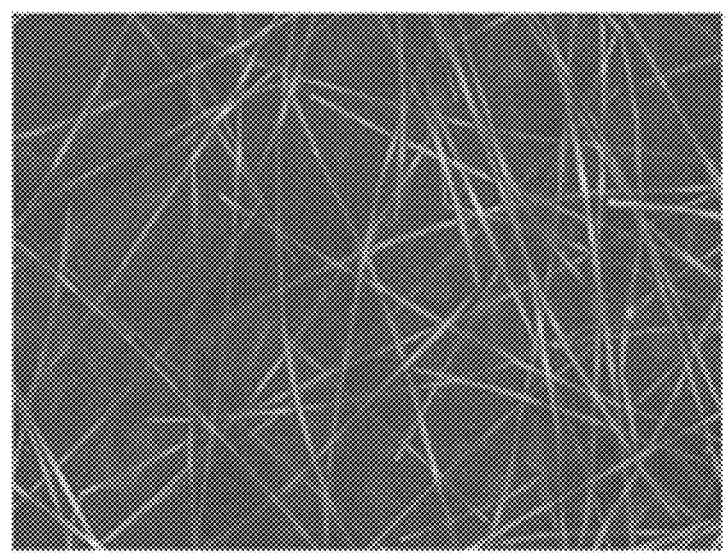
(b)
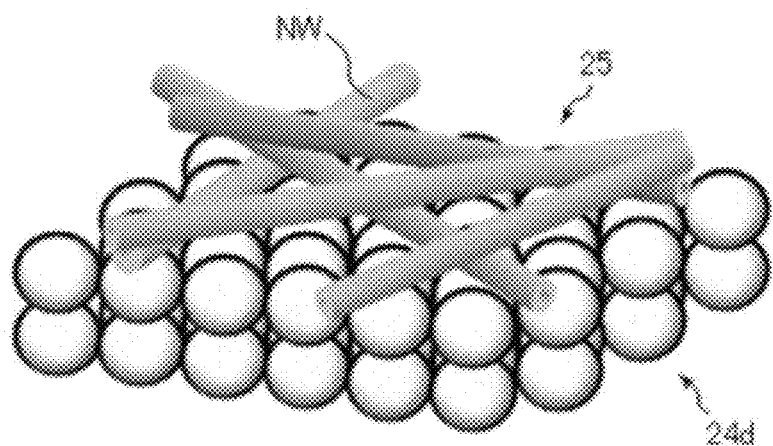
(c)
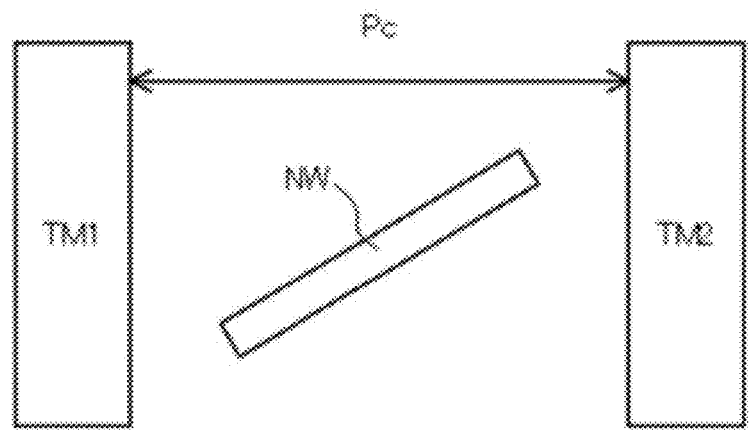

FIG.6
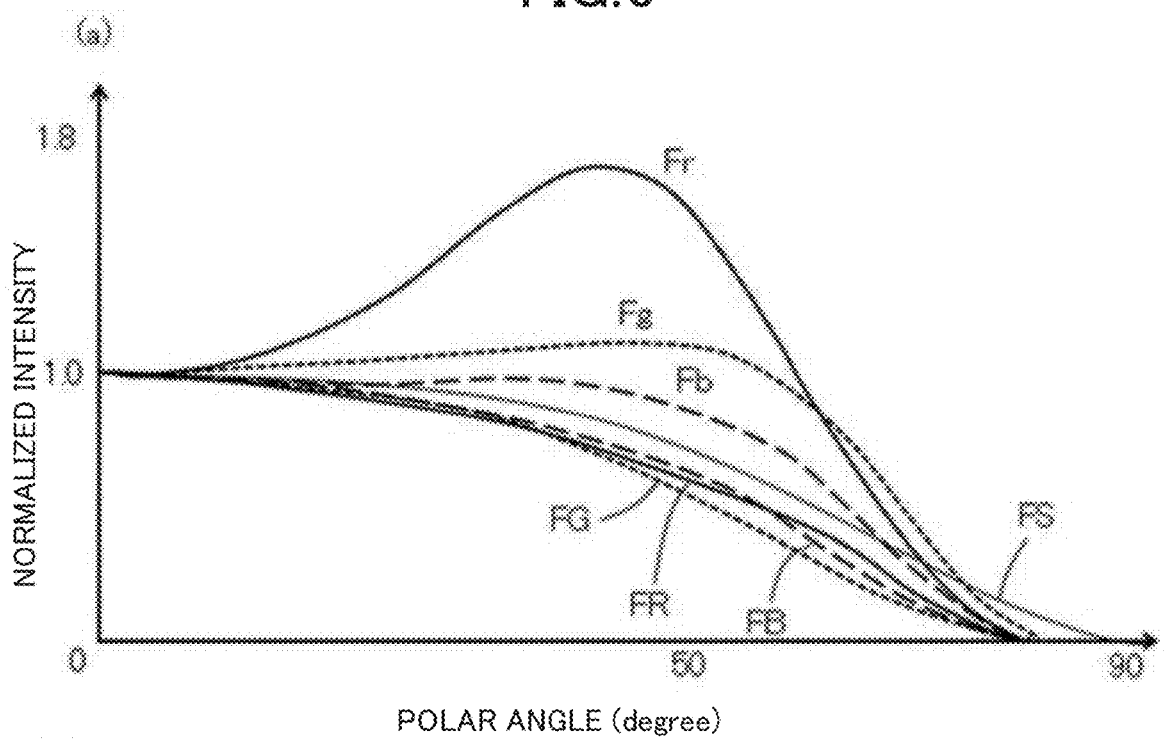
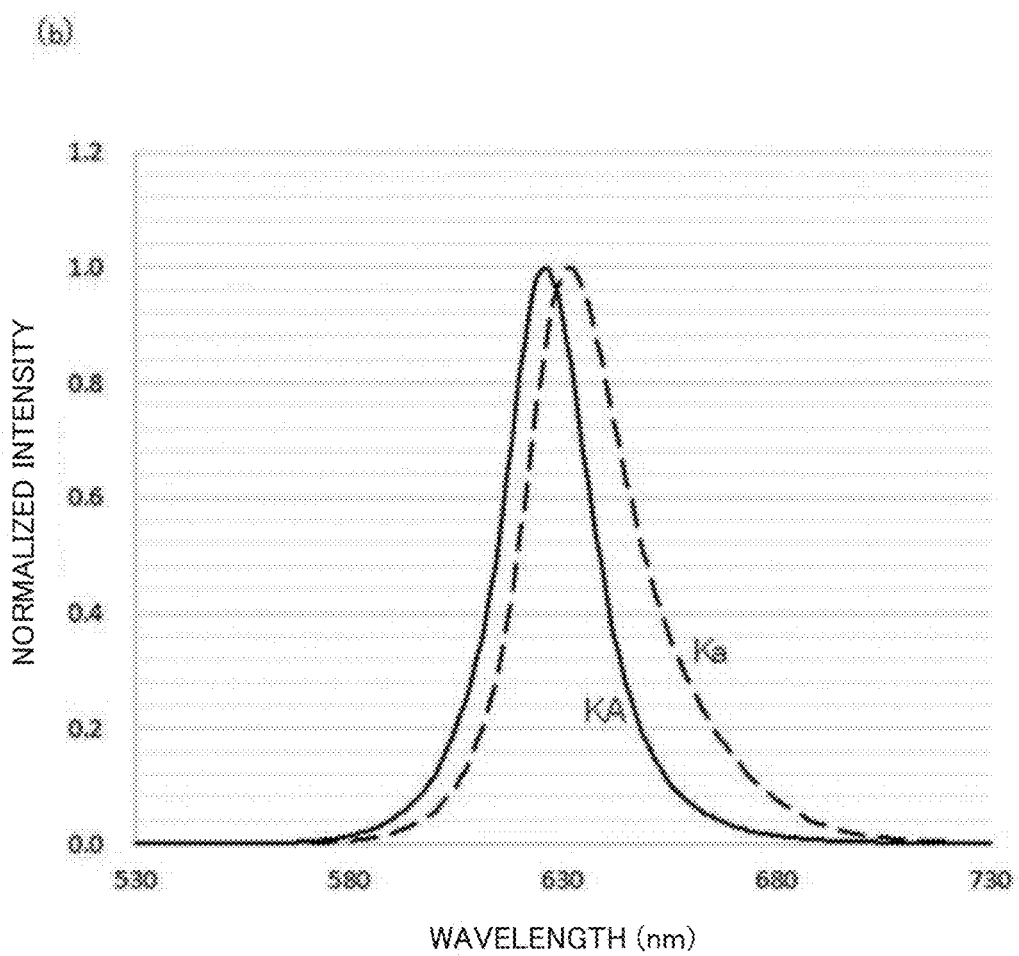

FIG.9
(a)
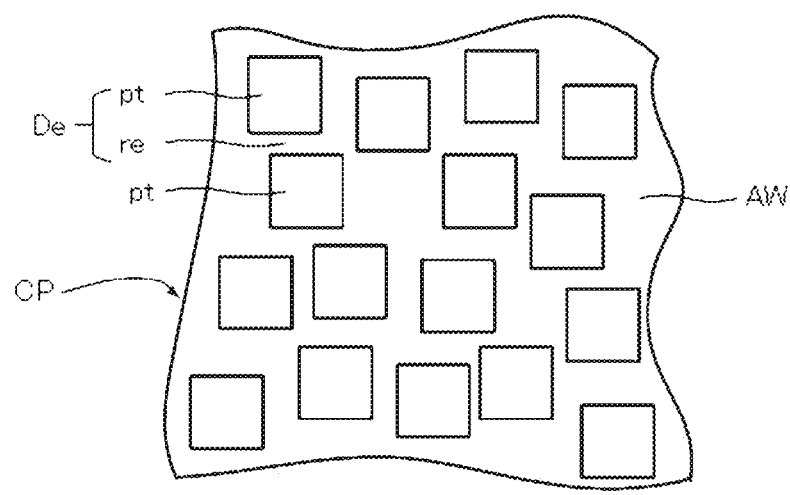
(b)
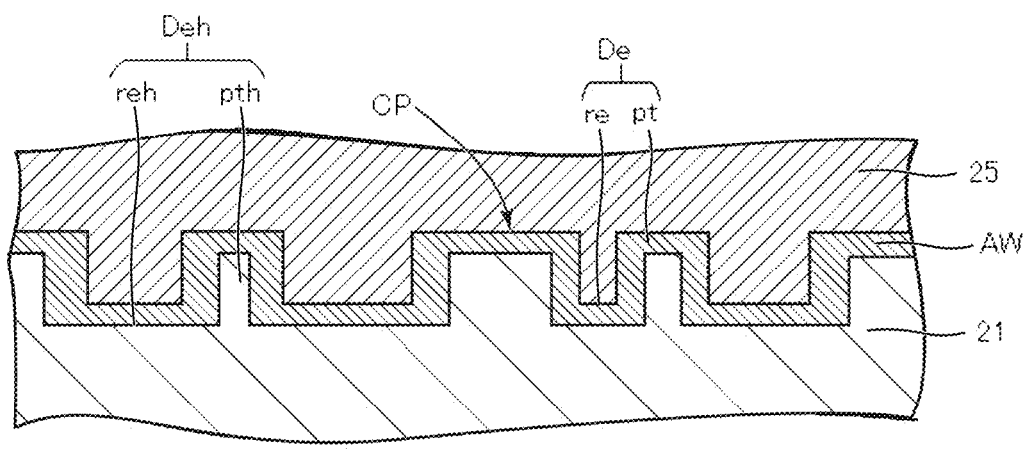
(c)
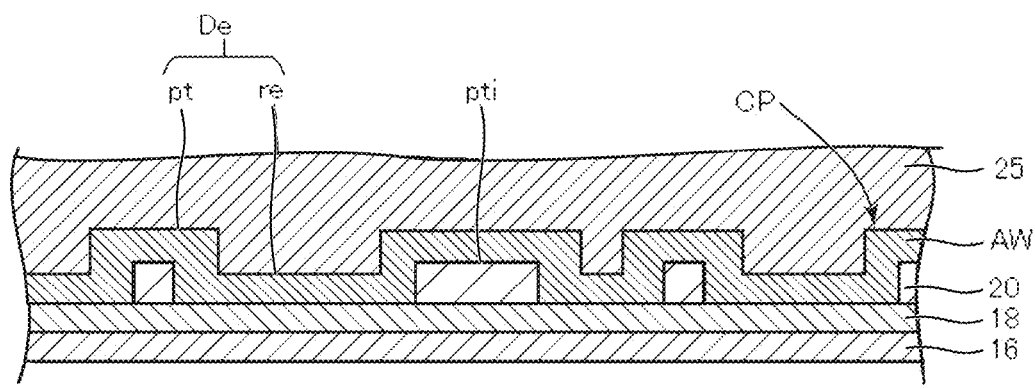

FIG.10
(a)
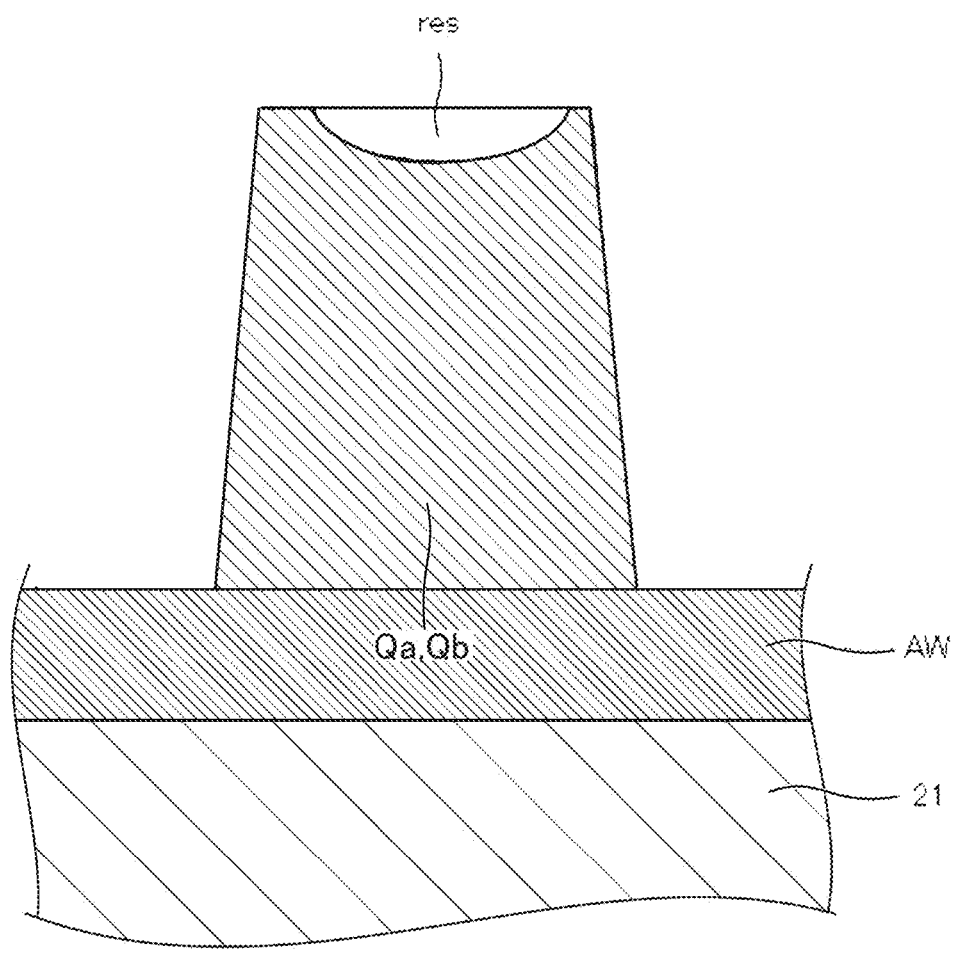
(b)
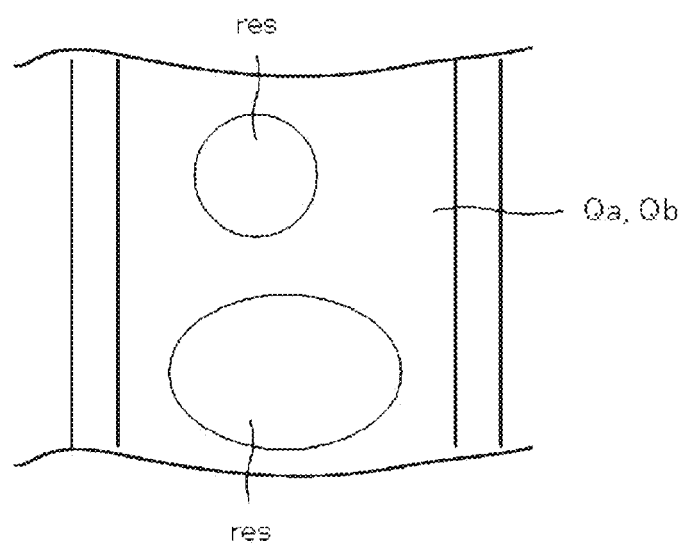

FIG.11
(a)
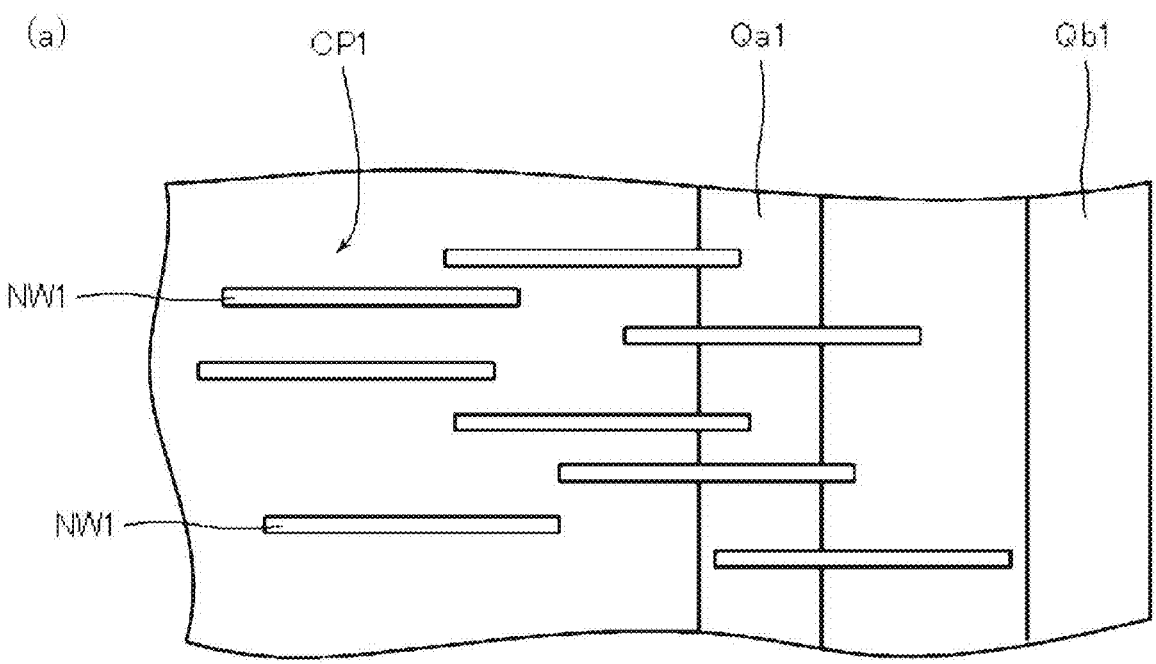
(b)
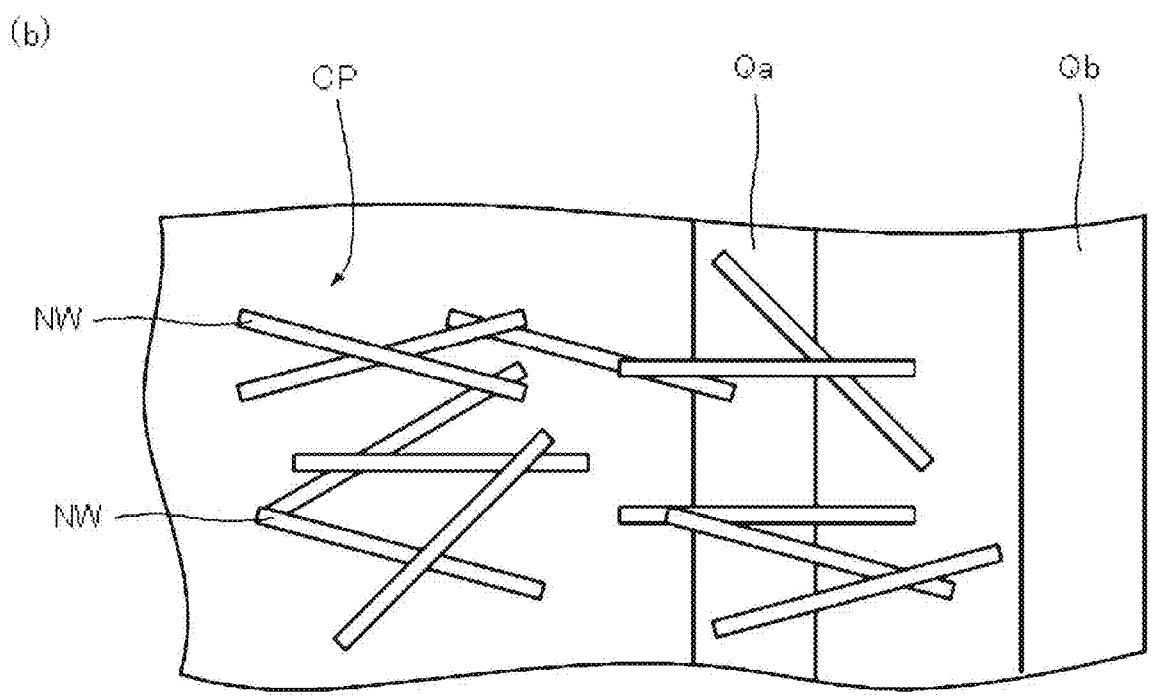

DISPLAY DEVICE AND MANUFACTURING METHOD FOR DISPLAY DEVICE

TECHNICAL FIELD

The disclosure relates to a display device and a method for manufacturing the display device.

BACKGROUND ART

A recently known top-emission display device uses, as its upper electrode, a transparent conductive film containing metal nanowires (c.f., Patent Literature 1 for instance)

CITATION LIST

Patent Literature

Patent Literature 1: Japanese Unexamined Patent Application Publication No. 2011-29037

SUMMARY

Technical Problem

In such a known display device, the upper electrode (second electrode) is formed by applying a solution containing the metal nanowires onto light emitter layers of all pixels, thus providing a common electrode shared among all the pixels. The known display device thus has, in its frame region surrounding its display region, a frame-shaped bank, which avoids the solution from leakage to the outside and defining the end of the upper electrode. The known display device further has, closer to the display region than the bank, a contact portion composed of a conductive film, which is in contact with the metal nanowires contained in the upper electrode, to thus electrically connect together the upper electrode and a terminal section, which is provided for voltage supply from an external power source to the upper electrode.

Unfortunately in the known display device, the upper electrode can locally have a large electrical resistance. To be specific, the known display device has an upper electrode containing metal nanowires formed by the solution application, during which the plurality of metal nanowires can be partly arranged in parallel on the contact portion, thereby possibly causing the upper electrode to locally have a large electrical resistance. The known display device can consequently involve poor contact between the upper electrode and terminal section, thus failing to supply voltage properly to the upper electrode, thereby causing poor display.

To solve this problem, it is an object of the disclosure to provide a display device that can avoid a local increase in the electrical resistance of its second electrode and has high display quality, and to provide a method for manufacturing such a display device.

Solution to Problem

To achieve the above object, a display device according to the disclosure has a display region, and a frame region surrounding the display region and including a terminal section. The display device also includes a thin-film transistor layer. The display device also includes a light emitter layer including a plurality of light emitters each having a first electrode, a light-emitting layer, and a second electrode. The plurality of light emitters are configured to emit mutually different colors of light. The second electrode is shared among the plurality of light emitters and contains a metal nanowire. The frame region includes a bank having a frame shape surrounding the display region and defining the end of the second electrode. A conductive film is disposed closer to the display region than the bank is. The conductive film electrically connects together the terminal section and the second electrode. The conductive film includes a contact portion being in contact with the metal nanowire. The contact portion has a plurality of asperities disposed on a contact surface being in contact with the metal nanowire.

In a method for manufacturing a display device according to the disclosure, the display device includes the following: a display region; a frame region surrounding the display region and including a terminal section; a thin-film transistor layer; and a light emitter layer including a plurality of light emitters each having a first electrode, a light-emitting layer, and a second electrode. The plurality of light emitters are configured to emit mutually different colors of light. The method includes a step of forming, in the frame region, a conductive film that electrically connects together the terminal section and the second electrode. The method also includes a step of forming, in the frame region, a bank having a frame shape that surrounds the display region and defines the end of the second electrode. The method also includes a step of forming the second electrode by applying a solution containing a metal nanowire dispersed in a solvent and by removing the solvent. The step of forming the conductive film includes forming a contact portion that is in contact with the metal nanowire and has a plurality of asperities on a contact surface that is in contact with the metal nanowire. The step of forming the second electrode includes bringing the solution into contact with the plurality of asperities to establish contact between a plurality of metal nanowires contained in the solution. The metal nanowire is included in the plurality of metal nanowires.

Advantageous Effect of Disclosure

The frame region includes the bank having a frame shape surrounding the display region and defining the end of the second electrode. The conductive film is disposed closer to the display region than the bank is. The conductive film electrically connects together the terminal section and second electrode. The conductive film includes the contact portion being in contact with the metal nanowire contained in the second electrode. The contact portion has the plurality of asperities on its contact surface being in contact with the metal nanowire. This configuration can thus avoid a plurality of metal nanowires from being arranged in parallel with each other at a site on the contact portion, thereby avoiding a local increase in the electrical resistance of the second electrode at the site. The configuration consequently offers a display device that can avoid a local increase in the electrical resistance of its second electrode and has high display quality, and the configuration also offers a method for manufacturing such a display device.

BRIEF DESCRIPTION OF DRAWINGS

FIG. 4(*a*) is a photograph illustrating a specific configuration of a second electrode shown in FIG. 2; FIG. 4(*b*) is a perspective view of a specific configuration of the second electrode; and FIG. 4 (*c*) is a schematic diagram illustrating the length of a metal nanowire contained in the second electrode.

FIGS. 6(*a*) and 6(*b*) are graphs each showing an effect of the second electrode shown in FIG. 2, with a light emitter layer shown in FIG. 2 having a quantum-dot light-emitting layer.

FIG. 9(*a*) is a plan view of a specific configuration of a contact portion shown in FIG. 8; FIG. 9(*b*) is an enlarged sectional view of the specific configuration in a region defined by IVb in FIG. 8; and FIG. 9(*c*) is an enlarged sectional view of the specific configuration in a region defined by IVc in FIG. 8.

FIG. 10(*a*) is an enlarged sectional view of a specific configuration of a bank shown in FIG. 8; and FIG. 10(*b*) is an enlarge plan view of the bank.

FIG. 11(*a*) illustrates a problem that occurs in a comparative example; and FIG. 11(*b*) illustrates an effect of the display device shown in FIG. 1.

FIG. 17(*b*) illustrates a specific configuration of a light emitter layer included in the display device according to the third embodiment of the disclosure; and FIG. 17(*c*) is a graph showing an effect of the display device according to the third embodiment of the disclosure.

DESCRIPTION OF EMBODIMENTS

The embodiments of the disclosure will be detailed with reference to the drawings. The disclosure is not limited to the following embodiments. Moreover, the term "in the same layer" hereinafter refers to that one layer is formed in the same process step (film formation step) as another thing. The term "in a lower layer than (or under)" hereinafter refers to that one layer is formed in a process step anterior to a process step of forming a comparative layer. The term "in a higher layer than (or above)" hereinafter refers to that one layer is formed in a process step posterior to a process step of forming a comparative layer. The dimension of components in each drawing is not a true dimension of the components and is not a true dimensional ratio of each component.

First Embodiment

Figure 1:
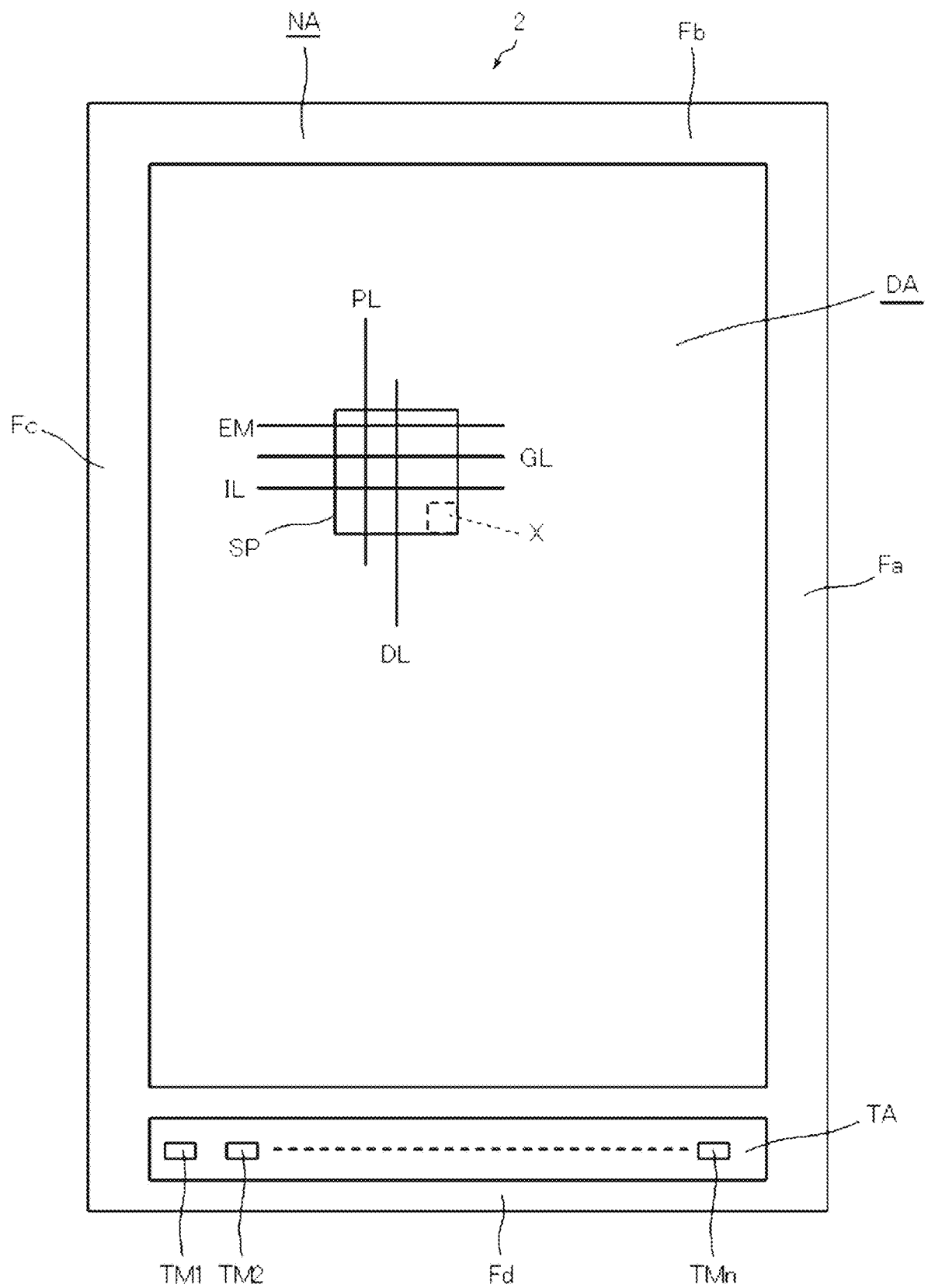
FIG. 1 is a schematic diagram illustrating a configuration of a display device according to a first embodiment of the disclosure.
Figure 2:
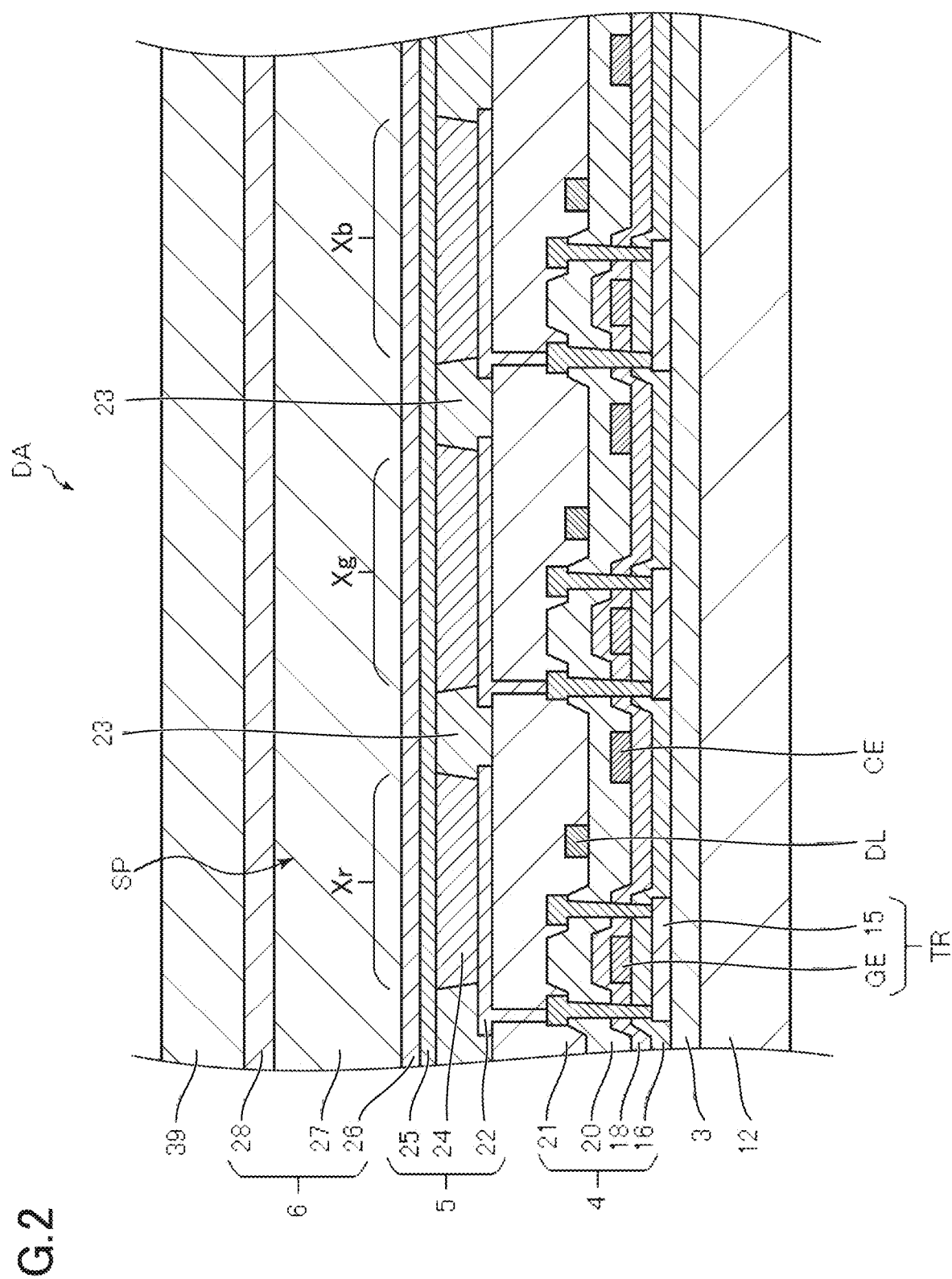
FIG. 2 is a sectional view of main components of the display device shown in FIG. 1.
Figure 3:
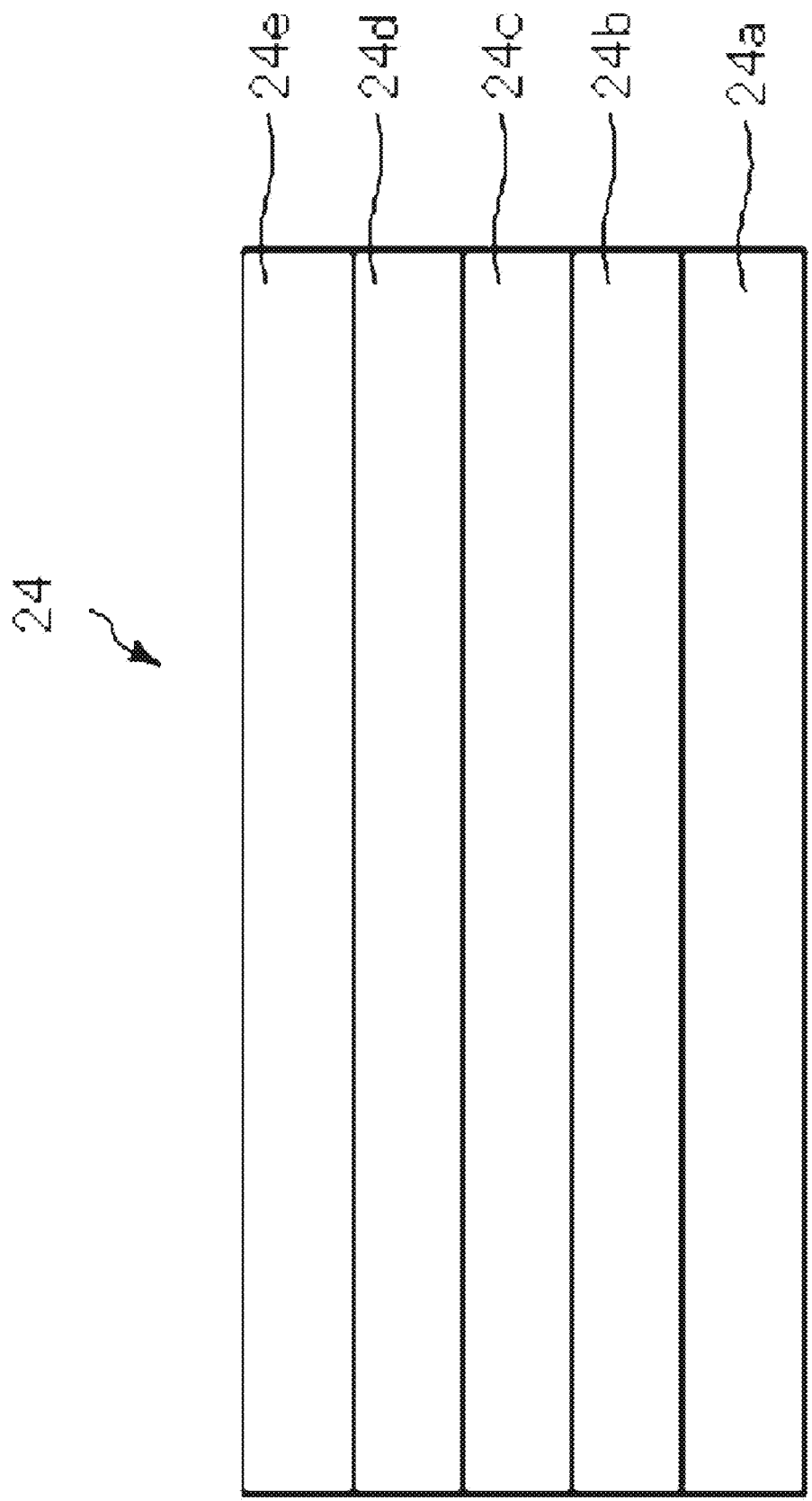
FIG. 3 is a sectional view of a specific configuration of a function layer shown in FIG. 2.
Figure 5:
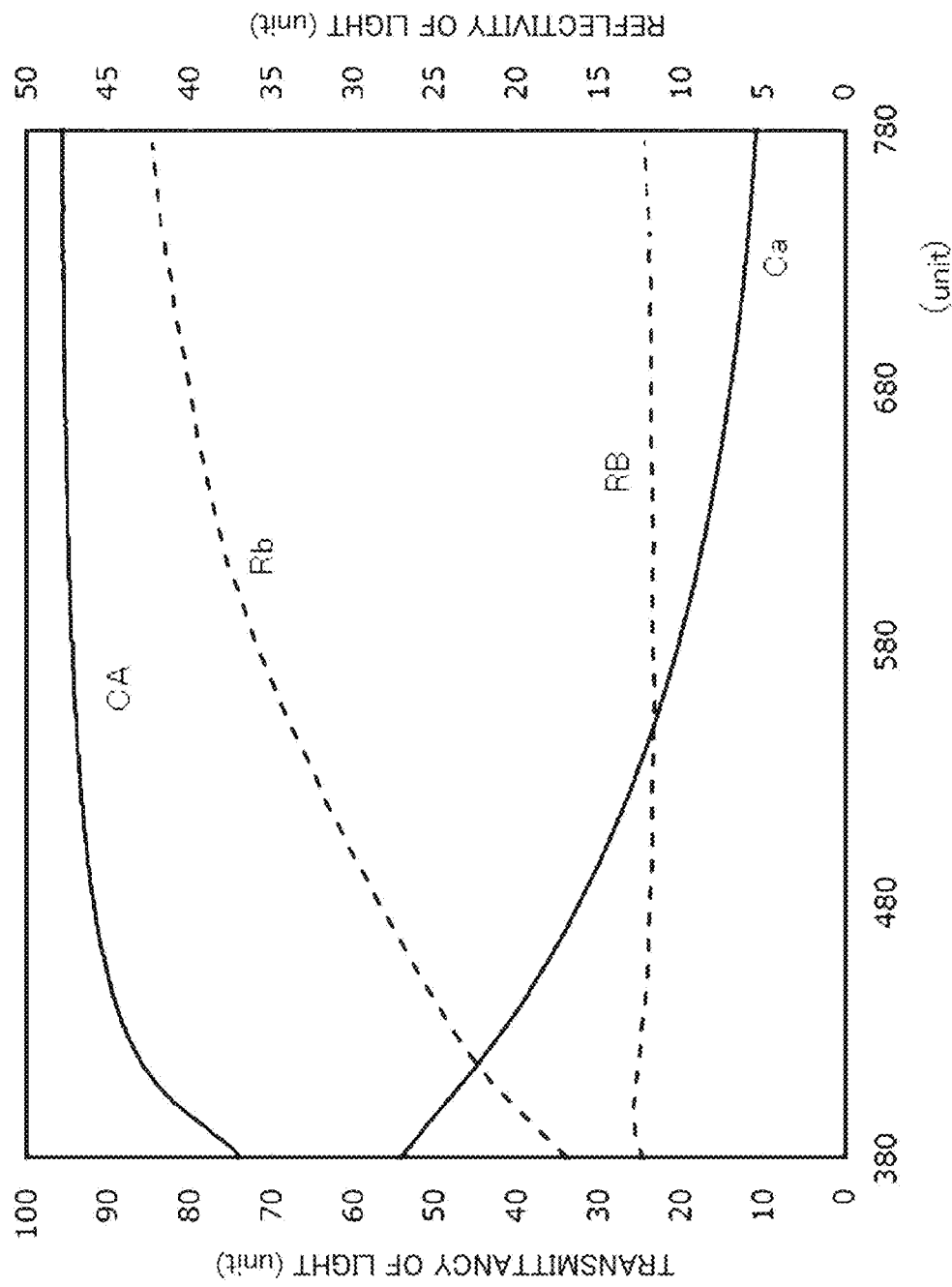
FIG. 5 is a graph showing an effect of the second electrode shown in FIG. 2.

FIG. 1 is a schematic diagram illustrating a configuration of a display device according to a first embodiment of the disclosure. FIG. 2 is a sectional view of main components of the display device shown in FIG. 1. FIG. 3 is a sectional view of a specific configuration of a function layer shown in FIG. 2. FIG. 4 (*a*) is a photograph illustrating a specific configuration of a second electrode shown in FIG. 2. FIG. 4 (*b*) is a perspective view of a specific configuration of the second electrode. FIG. 4 (*c*) is a schematic diagram illustrating the length of a metal nanowire contained in the second electrode. FIG. 5 is a graph showing an effect of the second electrode shown in FIG. 2.

FIGS. 1 and 2 show a display device 2 according to this embodiment. The display device 2 has a base 12 on which a barrier layer 3, a thin-film transistor (TFT) layer 4, a top-emission light emitter layer 5, and a sealing layer 6 are stacked sequentially. The display device 2 also has a display region DA in which a plurality of sub-pixels SP are arranged. The display region DA is surrounded by a frame region NA consisting of four side edges Fa to Fd, among which the side edge Fd includes a terminal section TA for mounting electronic circuit substrates (e.g., an IC chip and an FPC). The terminal section TA includes a plurality of terminals TM1, TM2, and TMn (where n is an integer equal to or greater than two). The plurality of terminals TM1, TM2, and TMn are arranged along one of the four sides of the display region DA, as illustrated in FIG. 1. It is noted that a driver circuit (not shown) can be placed at each of the side edges Fa to Fd.

The base 12 may be a glass board or a flexible board including a resin film of, but not limited to, polyimide. The base 12 can be a flexible board composed of two resin films and an inorganic insulating film interposed between the resin films. Furthermore, the base 12 may have a lower surface with a film of PET or other materials attached thereon. Moreover, using a flexible board as the base 12 can provide the display device 2 having flexibility, that is, a flexible display device 2.

The barrier layer 3 prevents foreign substances, such as water and oxygen, from entering the thin-film transistor layer 4 and light emitter layer 5. The barrier layer 3 can be composed of a silicon oxide film, a silicon nitride film, or a silicon oxide nitride film, all of which are formed through CVD, or can be composed of a stack of these layers.

As illustrated in FIG. 2, the thin-film transistor layer 4 includes the following: a semiconductor layer (including a semiconductor film 15) in a higher layer than the barrier layer 3; an inorganic insulating film 16 (gate insulating film) in a higher layer than the semiconductor layer; a first metal layer (including a gate electrode GE) in a higher layer than the inorganic insulating film 16; an inorganic insulating film 18 in a higher layer than the first metal layer; a second metal layer (including a capacitive electrode CE) in a higher layer than the inorganic insulating film 18; an inorganic insulating film 20 in a higher layer than the second metal layer; a third metal layer (including a data signal line DL) in a higher layer than the inorganic insulating film 20; and a flattening film 21 in a higher layer than the third metal layer.

The semiconductor layer is composed of, for instance, amorphous silicon, low-temperature polysilicon (LTPS), or an oxide semiconductor. The gate electrode GE and semiconductor film 15 together constitute a thin-film transistor TR.

Although this embodiment illustrates a top-gate thin-film transistor TR, the thin-film transistor TR may be a bottom-gate thin-film transistor.

The display region DA includes a light emitter X and a circuit for controlling the light emitter X, both of which are provided for each sub-pixel SP. Moreover, the thin-film transistor layer 4 includes these control circuits and wires connected to the circuits. Examples of the wires connected to the control circuits include, but not limited to, a scan signal line GL and a light-emission control line EM, both of which are disposed in the first metal layer, an initialization power-source line IL, which is disposed in the second metal layer, and the data signal line DL and a high-voltage power-source line PL, both of which are disposed in the third metal layer. Although not shown, each control circuit includes, but not limited to, the following: a drive transistor that controls current flowing through the light emitter X; a write transistor electrically connected to the scan signal line; and a light-emission control transistor electrically connected to the light-emission control line.

The first, second, and third metal layers are composed of a monolayer film of metal including at least one of, for instance, aluminum, tungsten, molybdenum, tantalum, chromium, titanium, and copper; alternatively these layers are composed of a laminated film of these materials.

The inorganic insulating films 16, 18, and 20 can be composed of a silicon oxide (SiOx) film or a silicon nitride (SiNx) film, both of which are formed through CVD, or can be composed of a laminate of these films. The flattening film 21 can be made of an organic material that can be applied, such as polyimide or acrylic resin.

The light emitter layer 5 includes the following: a first electrode (anode) 22 in a higher layer than the flattening film 21; an insulating edge cover film 23 coveting the edge of the first electrode 22; a function layer 24 in a higher layer than the edge cover film 23; and a second electrode (cathode) 25 in a higher layer than the function layer 24. That is, the light emitter layer 5 includes a plurality of light emitters X each having the following: the first electrode 22; a light-emitting layer (described later on), which is included in the function layer 24; and the second electrode 25. The plurality of light emitters X emit mutually different colors of light. The edge cover film 23 is formed by, for instance, applying an organic material, such as polyimide or acrylic resin, followed by patterning through photolithography. The function layer 24 is an electroluminescence (EL) layer containing an electroluminescence element.

The light emitter layer 5 includes a light emitter Xr (red), a light emitter Xg (green), and a light emitter Xb (blue) all included in the light emitters X and designed to emit mutually different colors of light. Each light emitter X includes the first electrode 22 in the form of an island, the function layer 24 (including the light-emitting layer), and the second electrode 25. The second electrode 25 is a common electrode shared among all the light emitters X, As described later on, the second electrode 25 is composed of metal nanowires and is formed by applying a solution containing the metal nanowires.

The light emitters Xr, Xg, and Xb each may be, for instance, an organic light-emitting diode (OLED) with a light-emitting layer (described later on) being an organic light-emitting layer, or each may be, for instance, a quantum-dot light-emitting diode (QLED) with the light-emitting layer being a quantum-dot light-emitting layer.

The function layer 24 has a stack of, in sequence from the bottom, a hole injection layer 24a, a hole transport layer 24b, a light-emitting layer 24c, an electron transport layer 24d, and an electron injection layer 24e for instance. The function layer 24 may include an electron blocking layer or a hole blocking layer. The light-emitting layer 24c is provided in the form of islands in the openings of the edge cover film 23 (for each sub-pixel) through evaporation, an ink-jet method, or photolithography. The other layers are provided in the form of islands or in a flat manner (common layer). The function layer 24 can have a configuration where one or more of the hole injection layer 24a, hole transport layer 24b, electron transport layer 24d and electron injection layer 24e are omitted.

Although this embodiment has described a configuration where the anode (first electrode 22), the function layer 24, and the cathode (second electrode 25) are stacked sequentially on the thin-film transistor layer 4, as illustrated in FIG. 2, any configuration may be provided. That is, the cathode, the function layer 24, and the anode may be stacked on the thin-film transistor layer 4 in this order. The function layer 24 in this case has a stack of, in sequence from the bottom, the electron injection layer 24e, the electron transport layer 24d, the light-emitting layer 24c, the hole transport layer 24b, and the hole injection layer 24a.

To form the organic light-emitting layer (light-emitting layer 24c) of an OLED through evaporation, a fine metal mask (FMM) is used. An FMM is a sheet (made of Invar for instance) having many openings, through one of which an organic substance passes, thus forming an organic layer (corresponding to a single sub-pixel SP) in the form of an island.

The quantum-dot light-emitting layer (light-emitting layer 24c) of a QLED can be formed by, for instance, applying a solution with quantum dots dispersed within a solvent, followed by patterning through an inkjet method or photolithography, thus forming a quantum-dot light-emitting layer (corresponding to a single sub-pixel SP) in the form of an island.

The first electrode 22 is composed of a stacked layer of indium tin oxide (ITO) and silver (Ag) or is composed of a stacked layer of ITO and Ag-containing alloy, for instance. The anode 22 reflects light. The second electrode 25 (cathode) contains metal nanowires (e.g., silver nanowires), as described later on, and has high light transparency.

When each of the light emitters Xr, Xg and Xb is an OLED, a drive current between the first electrode 22 and second electrode 25 rejoins holes and electrons within the light-emitting layer, thus generating excitons. These excitons emit light in the process of transition to a ground state. The second electrode 25 has high light transparency, and the first electrode 22 reflects light; accordingly, light emitted from the function layer 24 travels upward and goes out from the top.

When each of the light emitters Xr, Xg and Xb is a QLED, a drive current between the first electrode 22 and second electrode 25 rejoins holes and electrons within the light-emitting layer, thus generating excitons. These excitons emit light (fluorescent light) in the process of transition from a conduction band level of the quantum dots to a valence band level of the quantum dots.

The light emitter layer 5 may include, but not limited to, light emitters including inorganic light-emitting diodes, other than such OLEDs and QLEDs as described above.

The sealing layer 6 is transparent to light and includes the following: an inorganic sealing film 26 directly disposed on the second electrode 25 (that is, the inorganic sealing film 26 is in contact with the second electrode 25); an organic film 27 in a higher layer than the inorganic sealing film 26; and an inorganic sealing film 28 in a higher layer than the organic film 27. The sealing layer 6, which covers the light emitter layer 5, prevents foreign substances, such as water and oxygen, from penetrating the light emitter layer 5.

The organic film 27 flattens another layer or film and has light transparency. The organic film 27 can be formed through, for instance, inkjet application using an organic material that can be applied. Each of the inorganic sealing films 26 and 28 is an inorganic insulating film. The inorganic sealing films 26 and 28 can be composed of a silicon oxide film, a silicon nitride film, or a silicon oxide nitride film, all of which are formed through CVD for instance, or can be composed of a stack of these films.

A function film 39 serves as, but not limited to, at least one of an optical compensator, a touch sensor and a protector.

The second electrode 25 in this embodiment contains metal nanowires, which are herein silver nanowires NW in the form of a mesh, as illustrated in FIGS. 4(a) and 4(b). Thus, the graph in FIG. 5 demonstrates that the second electrode 25 that contains the silver nanowires NW each having a diameter of 25 nm with a maximum of five stacked layers has transmittancy of light (CA) higher in a wavelength region of 380 nm to 780 nm than the transmittancy of light (Ca) of a silver thin-film electrode (20 nm thick), which is a comparative target, and that this second electrode 25 has over 80% transmittancy of light in a wavelength region of 400 nm to 780 nm. The graph in FIG. 5 also demonstrates that the reflectivity of light (RB) of the foregoing second electrode 25 is lower in the wavelength region of 380 nm to 780 nm than the reflectivity of light (Rb) of the comparative target, i.e., the silver thin-film electrode, and that the reflectivity of light (RB) of this second electrode 25 is less than 15% in the wavelength region of 400 nm to 780 nm.

As described above, the display device 2 in this embodiment, which has an upper electrode, i.e., the second electrode 25 containing the silver nanowires NW in the form of a mesh, can improve the efficiency of light taking in the top-emission display device 2 and can offer a good visual property.

The number of stacked layers of the silver nanowires NW in the second electrode 25 is two to eight and is preferably three to six. Each silver nanowire NW has a diameter ($\Phi$) of 5 to 100 nm, preferably has a diameter ($\Phi$) of 10 to 80 nm and more preferably has a diameter ($\Phi$) of 20 to 50 nm. The silver nanowire NW has a length (trace length) of 1 to 100 µm, preferably has a length of 5 to 50 µm and more preferably has a length of 8 to 30 µm. It is noted that these values can be obtained through observation with a scanning electron microscope or other equipment. The silver nanowire NW has an electrical resistance (surface resistance) of 5 to 200 ($\Omega$/Sq), preferably has an electrical resistance of 10 to 100 ($\Omega$/Sq) and more preferably has an electrical resistance of 10 to 50 ($\Omega$/Sq).

As illustrated in FIG. 4(c), the silver nanowire NW has a length (average trace length) smaller than the distance (inter-terminal width), Pc, between the terminals TM1 and TM2, which are adjacent to each other in the terminal section TA. This can avoid a short circuit between the terminals TM1 and TM2 resulting from the silver nanowires NW (metal nanowires) that intrude into the terminal section TA when the second electrode 25 is formed.

Although Ag is used in this embodiment as the material of the metal nanowires contained in the second electrode 25, any material may be used. A single-metal nanowire made of any one of Au, Al and Cu may be used; alternatively, an alloy nanowire containing two or more of Ag, Au, Al and Cu may be used.

With reference to FIG. 6, the following specifically describes an optical effect of a configuration where a quantum-dot light-emitting layer is used for the light emitter layer 5 and where the foregoing metal nanowire is used for the second electrode 25. FIGS. 6(a) and 6(b) are graphs each showing an effect of the second electrode shown in FIG. 2, with the light emitter layer in FIG. 2 having a quantum-dot light-emitting layer.

FIG. 6(a) shows the characteristic of a polar angle and of normalized intensity of light. The graph in FIG. 6(a) demonstrates that the characteristic of the device in this embodiment, where a quantum-dot light-emitting layer and the second electrode (silver nanowire NW) 25 are used in combination, i.e., a characteristic FR of red, a characteristic FG of green, and a characteristic FB of blue in this embodiment, is closer to a Lambertian light-distribution characteristic FS in all the three colors than the characteristic of a device in a comparative example, where a quantum-dot light-emitting layer and a silver thin-film electrode are used in combination, i.e., a characteristic Fr of red, a characteristic Fg of green, and a characteristic Fb of blue in the comparative example. Here, in the device in this embodiment and the device in the comparative example, the thicknesses of a carrier injection layer, a carrier transport layer and a light emitting layer are commonized between the colors. Herein, a Lambertian light-distribution characteristic is an ideal light-distribution characteristic, where radiant intensity in the direction of an angle $\theta$ is indicated by $\cos\theta$ times of the radiant intensity on an optical axis, with the vertical front set at 0 degrees. In addition, a carrier includes each of an electron and a hole.

FIG. 6(b) shows a red-light emission property Ka in a comparative example, where a quantum-dot light-emitting layer (designed to emit red light having, for instance, a PL peak wavelength of 620 nm and a half-value breadth of 25 nm) and a silver thin-film electrode having large reflectivity of light are used in combination. The graph in FIG. 6(b) demonstrates that in the red-light emission property Ka, an inter-electrode cavity effect (resonance effect) adversely affects the peak wavelength, which herein shifts toward a long wavelength to thus exceed 630 nm, and adversely affects the half-value breadth, which herein increases to 32 nm, whereas the device in this embodiment, where the foregoing quantum-dot light-emitting layer (designed to emit red light) and the second electrode (silver nanowires NW) 25 are used in combination, exhibits a red-light emission property KA with little change, where the peak wavelength is herein in a reasonable position (about 620 nm) and where the half-value breadth is herein 25 nm.

As described above, using a high-transmittancy metal nanowire (e.g., the silver nanowires NW) in the second electrode 25 little exhibits a cavity effect. Using such a metal nanowire in a QLED, which is adversely affected by the cavity effect, can consequently achieve a greater effect (i.e., an improvement in visual angle property). In addition, since the cavity effect appears little, as shown in FIG. 6(a), the thicknesses of the individual layers between the first electrode 22 and second electrode 25 can be brought close to a Lambertian light-distribution without having to be adjusted to an optimal value among the light emitters Xr, Xg and Xb, and the thicknesses of the individual layers can be common (same). This configuration in the present embodiment facilitates manufacturing the display device 2 that has a high visual-angle property.

Figure 7:
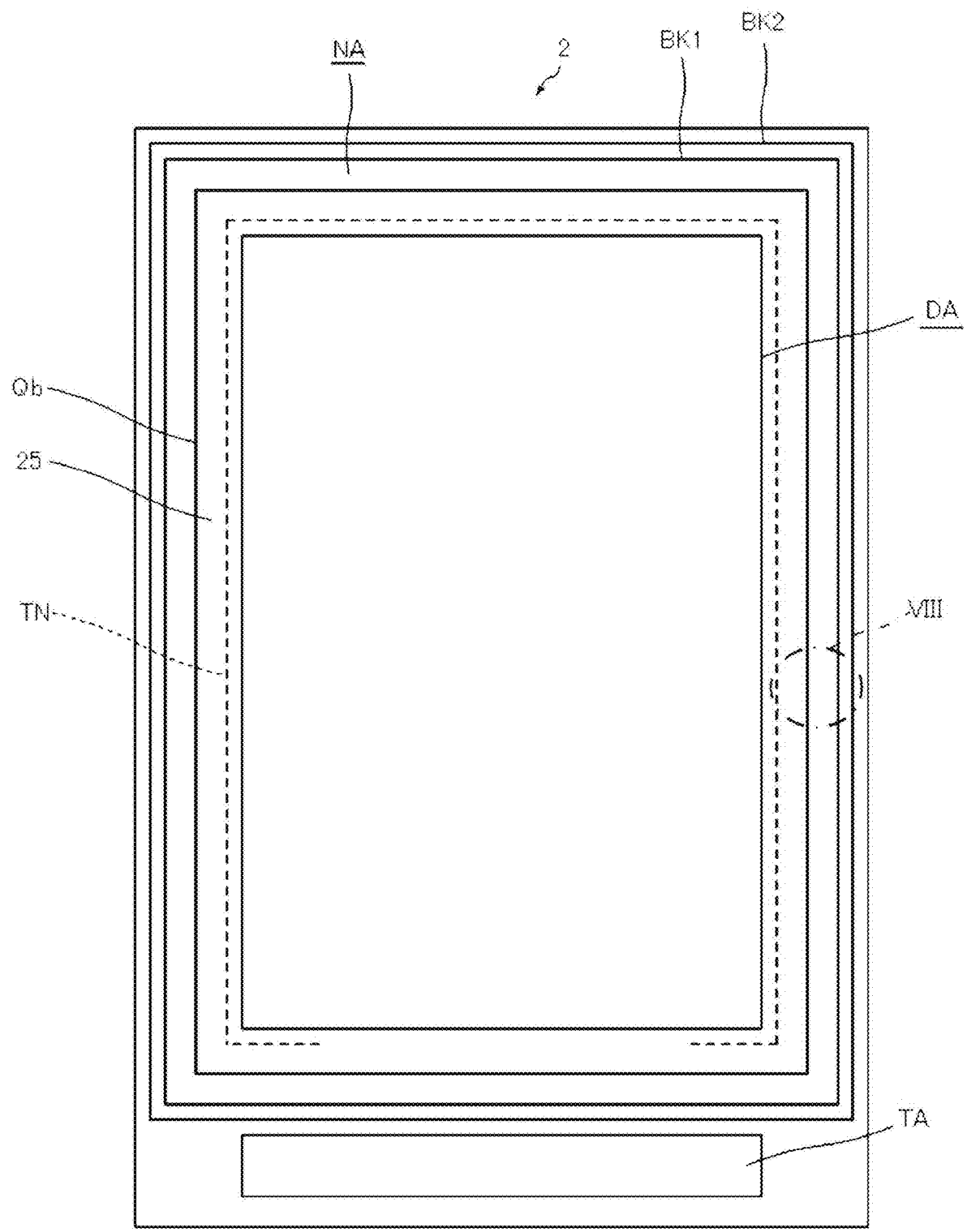
FIG. 7 is a plan view of the main components of the display device shown in FIG. 1.
Figure 8:
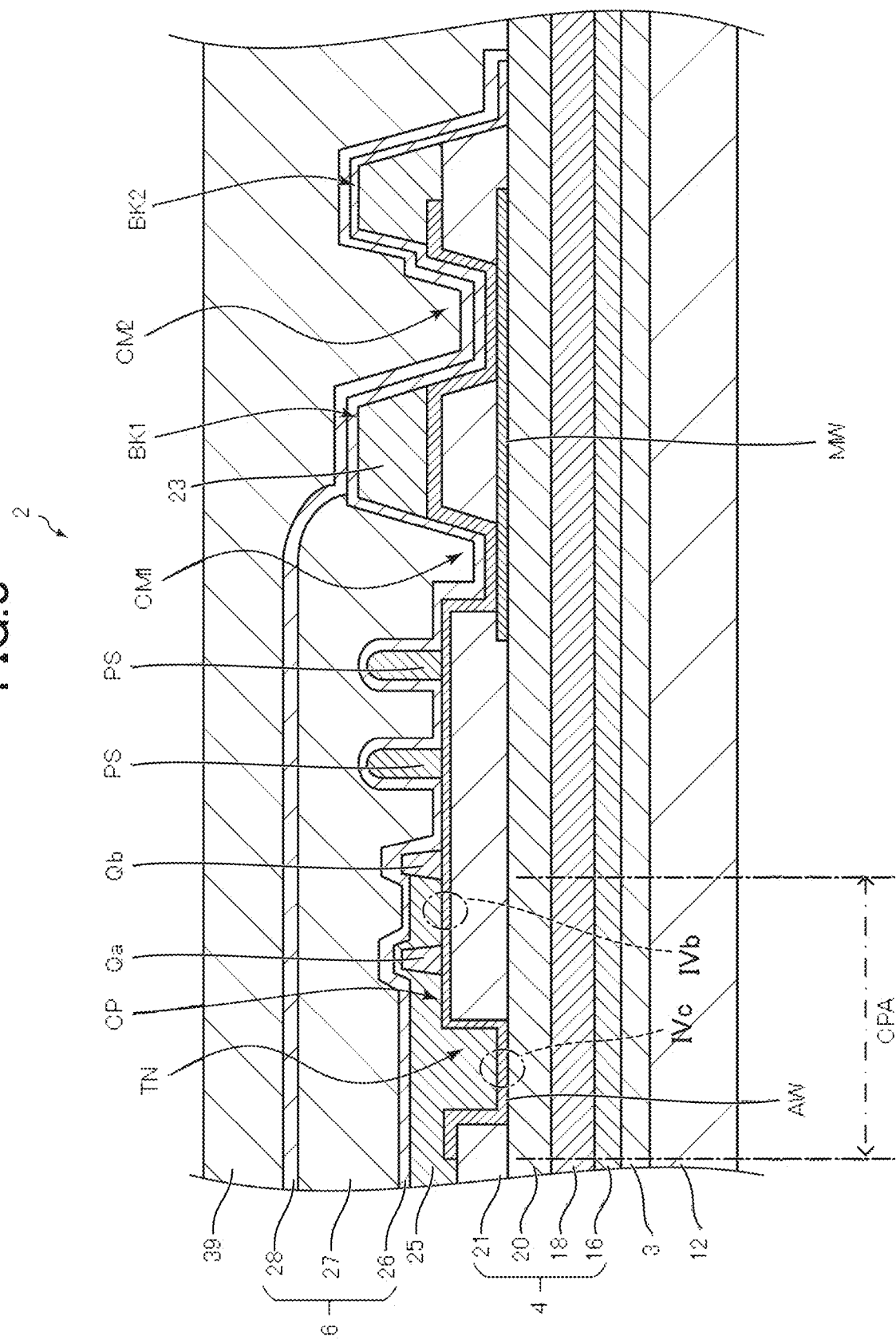
FIG. 8 is a sectional view of the main components in a region defined by VIII in FIG. 7.

With reference now to FIGS. 7 to 11, main components of the display device 2 in this embodiment will be specifically described. FIG. 7 is a plan view of the main components of the display device shown in FIG. 1. FIG. 8 is a sectional view of the main components in a region defined by VIII in FIG. 7. FIG. 9 (a) is a plan view of a specific configuration of a contact portion shown in FIG. 8. FIG. 9 (b) is an enlarged sectional view of the specific configuration in a region defined by IVb in FIG. 8. FIG. 9 (c) is an enlarged sectional view of the specific configuration in a region defined by IVc in FIG. 8. FIG. 10 (a) is an enlarged sectional view of a specific configuration of a bank shown in FIG. 8. FIG. 10 (*b*) is an enlarge plan view of the bank. FIG. 11 (*a*) illustrates a problem that occurs in a comparative example. FIG. 11 (*b*) illustrates an effect of the display device shown in FIG. 1.

As illustrated in FIGS. 7 and 8, the frame region NA of the display device 2 in this embodiment has a trench TN disposed in the flattening film 21. Disposed outside the trench TN is banks BK1 and BK2 provided for sealing. These sealing banks BK1 and BK2 define the end of the organic film 27 of the sealing layer 6. The sealing banks BK1 and BK2 each have a portion disposed in the same layer and made of the same material as the flattening film 21, and a portion stacked thereon, disposed in the same layer and made of the same material as the edge cover film 23, as illustrated in FIG. 8. It is noted that other than the foregoing description, the sealing banks BK1 and BK2 may be disposed in the same layer and made of the same material as either the flattening film 21 or the edge cover film 23. The sealing bank BK1 is a liquid-blocking structure that blocks droplets generated when the organic film 27 is formed, and the sealing bank BK2 is an auxiliary structure that blocks droplets coming over from the sealing bank BK1.

As denoted by a dotted line in FIG. 7, the trench TN of the display device 2 in this embodiment surrounds, in a plan view, part of one of the four sides of the display region DA in which the terminal section TA is located and surrounds, in the plan view, all the remaining three sides.

As illustrated in FIGS. 7 and 8, the frame region NA of the display device 2 in this embodiment includes banks Qa and Qb surrounding the display region DA and defining the end of the second electrode 25. Here, each of the banks Qa and Qb is provided in the form of a frame. In addition, FIG. 8 shows a conductive film AW, which is disposed closer to the display region DA than the banks Qa and Qb and electrically connects the terminal section TA and second electrode 25 together. The conductive film AW includes a contact portion CP being in contact with the foregoing silver nanowires NW (metal nanowires), which is contained in the second electrode 25. As denoted by a dot-dashed bidirectional arrow CPA in FIG. 8, the contact portion CP in this embodiment is disposed in a region between the end of the conductive film AW close to the display region DA and the bank Qb, i.e., a region in which the second electrode 25 is disposed. The contact portion CP has a plurality of asperities on its surface being in contact with the foregoing silver nanowires NW (metal nanowires). The details will be described later on.

The conductive film AW is disposed in the same layer and made of the same material as the first electrode 22 for instance. Further in this embodiment, a power-source trunk wire MW is provided that is electrically connected to the conductive film AW, disposed in the same layer and made of the same material as, for instance, a source wire SH (third metal layer). The terminal section TA and the second electrode 25 are electrically connected together via the conductive film AW and power-source trunk wire MW.

To be specific, the banks Qa and Qb as well as a plurality of photo-spacers PS are arranged between the trench TN and sealing bank BK1 sequentially from near the display region DA, as illustrated in FIG. 8. The bank Qb defines the end of the second electrode 25, as illustrated in FIG. 8. That is, the bank Qb serves as a liquid blocker when the solution containing the silver nanowires NW, which are the material of the second electrode 25, is applied. In some embodiments, the bank Qa, which is on the inside, may define the end of the second electrode 25 (i.e., the bank Qa may serve as a liquid blocker). The banks Qa and Qb are disposed in the same layer and made of the same material as the edge cover film 23 for instance. Although this embodiment has described a dual structure, i.e., the banks Qa and Qb by way of example, any component may be provided that defines the end of the second electrode 25. That is, a frame-shaped bank of single-ply structure may be provided for instance.

Each of the plurality of photo-spacers PS has an upper surface that serves as a surface with which an evaporation mask is brought into contact when each layer consisting of an evaporation film, which is included in the function layer 24, is formed. The photo-spacers PS surround the perimeter of the display region DA. Like the banks Qa and Qb, the photo-spacers PS are disposed in the same layer and made of the same material as the edge cover film 23 for instance, and as illustrated in FIG. 8, the photo-spacers PS are thicker than the banks Qa and Qb. That is, the banks Qa and Qb are thinner than the photo-spacers PS (i.e., the banks Qa and Qb have a small height when measured from the conductive film AW). The device in this embodiment avoids the banks Qa and Qb from damage, such as cracking, resulting from their contact with the evaporation mask, and the device in this embodiment avoids poor light emission in the sub-pixels SP due to foreign substances, such as cracks, intruding into the display region DA.

As illustrated in FIG. 8, the conductive film AW extends astride the trench TN and extends in the frame region NA so as to overlap the sealing bank BK2, which is on the outside. Also disposed inside the sealing bank BK1 is a contact groove CM1 penetrating the flattening film 21 and edge cover film 23. Also disposed between the sealing banks BK1 and BK2 is a contact groove CM2 penetrating the flattening film 21 and edge cover film 23. The power-source trunk wire MW is exposed in the contact grooves CM1 and CM2 to be thus in contact with the conductive film AW, and the power-source trunk wire MW and the conductive film AW are thus electrically connected together. The power-source trunk wire MW is connected to a cathode power-source voltage (ELVSS) via the terminal section TA, and the cathode power-source voltage is supplied to the second electrode 25 from the power-source trunk wire MW via the conductive film AW.

The conductive film AW covers the trench TN at the contact portion CP and is, within the frame of the bank Qb, in contact with the silver nanowires NW, which are contained in the second electrode 25. The contact portion CP is thus configured to electrically connect the terminal section TA and second electrode 25 together.

As illustrated in FIGS. 9(*a*) to 9(*c*), the contact portion CP has, on its surface (i.e., the upper surface of the conductive film AW) being in contact with the silver nanowires NW, a plurality of asperities De disposed non-uniformly (in a random manner). In detail, the contact portion CP has, on the upper surface of the conductive film AW, a plurality of protrusions pt disposed non-uniformly, and a plurality of recesses re disposed between the protrusions pt adjacent to each other. Each protrusion pt protrudes to a degree of 100 nm to 2 μm for instance. In addition, the size of each recess re, i.e., the distance between the adjacent protrusions pt, is set to be larger than the diameter of the silver nanowire NW. Furthermore, the distance between the adjacent protrusions pt is preferably, for instance, smaller than ten times of the length of the silver nanowire NW (average trace length). Such a configuration can avoid a mutually-parallel arrangement of the plurality of silver nanowires NW with more certainty. Although FIG. 9(*a*) illustrates, by way of example, the protrusions pt each having a rectangular shape in a plan view, protrusions each having another shape in a plan view;

such as a circular shape, can be also used. The asperities De do not have to be arranged all across the upper surface of the conductive film AW. The asperities De need to be arranged on at least part of the upper surface being in contact with the silver nanowires NW.

As illustrated in FIG. 9(b), at the contact portion CP, the asperities De of the contact portion CP are formed, on the conductive film AW located on the flattening film 21, following asperities Deh of the flattening film 21. That is, at the contact portion CP, the flattening film 21 under the conductive film AW has, on its surface close to the conductive film AW, a plurality of asperities Deh, i.e., a plurality of protrusions pth disposed non-uniformly and a plurality of recesses reh disposed between the protrusions pth adjacent to each other. Moreover, disposed on the contact surface of the contact portion CP are the asperities De arranged in correspondence with the asperities Deh. Here, the asperities Deh of the flattening film 21 are formed through, for instance, half exposure to light when the flattening film 1 is formed.

As illustrated in FIG. 9(c), at the contact portion CP, the asperities De of the contact portion CP are formed, on the conductive film AW located on the inorganic insulating film 20, following a plurality of island-shaped protrusions pti of the inorganic insulating film 20. That is, at the contact portion CP, the inorganic insulating film 20 under the conductive film AW has the plurality of island-shaped protrusions pti disposed non-uniformly. Moreover, disposed on the contact surface of the contact portion CP are the protrusions pt of the asperities De arranged in correspondence with the plurality of island-shaped protrusions pti, and as described above, the recesses re of the asperities De are disposed between the adjacent protrusions pt. Here, the plurality of island-shaped protrusions pti of the inorganic insulating film 20 are formed through, for instance, patterning (opening) when the inorganic insulating film 20 is formed. Other than the foregoing description, the inorganic insulating film 18 under the inorganic insulating film 20 may undergo patterning to form a plurality of island-shaped protrusions in the inorganic insulating film 18, or the inorganic insulating film 16 under the inorganic insulating film 18 may undergo patterning to form a plurality of island-shaped protrusions in the inorganic insulating film 16, thus forming the asperities De of the contact portion CP. Furthermore, other than the forgoing description, the surface of the inorganic insulating film 20 close to the conductive film AW may have a plurality of asperities, for instance, instead of the plurality of island-shaped protrusions pti. That is, asperities may be provided in the inorganic insulating film 20 with a super-thin coating film left near the conductive film AW.

As illustrated in FIGS. 10(a) and 10(b), the banks Qa and Qb each have a surface provided with a plurality of recesses res. In detail, the banks Qa and Qb each have a surface provided with the recesses res each having, for instance, an arc shape in a sectional view. Each recess res is dented to a degree greater than the diameter of the silver nanowire NW. Although FIG. 10(b) illustrates, by way of example, the recesses res each having a circular or elliptic shape in a plan view; recesses each having another shape in a plan view, such as a rectangular shape, can be also used. Other than the foregoing description, a protrusion protruding upward may be disposed between the recesses res adjacent to each other.

As described above, the display device 2 in this embodiment has the plurality of asperities De on the contact surface of the contact portion CP, and the plurality of recesses res on the surfaces of the banks Qa and Qb. The display device 2 in this embodiment can accordingly avoid a local increase in the electrical resistance (sheet resistance) of the second electrode 25.

To be specific, FIG. 11(a) illustrates a configuration in a comparative example, where no such recesses, protrusions, and asperities as describes above are provided, i.e., a configuration that includes a contact portion CP1 having a smooth (flat) contact surface, and banks Qa1 and Qb1 having their flat surfaces. In this comparative example, a plurality of metal nanowires NW1 are arranged in parallel with each other on the contact surface of the contact portion CP1 and the surface of the bank Qa1, as illustrated in FIG. 11(a). The plurality of metal nanowires NW1, which are arranged onto the contact surface of the contact portion CP1 and the surface of the bank Qa1 through application of a solution containing the metal nanowires NW1, particularly tend to be arranged in parallel with each other in accordance with the spread of the applied solution. The configuration in the comparative example can consequently involve a local increase in the electrical resistance (sheet resistance) of the second electrode containing the metal nanowires NW1, thereby possibly causing poor contact, thus possibly causing poor display, such as brightness unevenness.

The device in this embodiment by contrast has the plurality of asperities De disposed non-uniformly on the contact surface of the contact portion CP, and the plurality of recesses res disposed on the surfaces of the banks Qa and Qb. The plurality of silver nanowires NW (metal nanowires) of the device in this embodiment are hence arranged on the contact surface of the contact portion CP and the surface of the bank Qa so as not to be in parallel with each other, but to be in contact with and overlap each other, as illustrated in FIG. 11(b), which illustrates a configuration different from that in the comparative example. That is, when the solution containing the silver nanowires NW is applied, the asperities De and recesses res of the device in this embodiment disturb the direction of spread of the solution, thereby providing an arrangement in which the plurality of silver nanowires NW are partly in contact with each other. The device in this embodiment can consequently avoid, with certainty, a local increase in the electrical resistance (sheet resistance) of the second electrode 25 containing the silver nanowires NW. The device in this embodiment can accordingly avoid poor contact in the second electrode 25 and thus can avoid poor display, such as brightness unevenness.

The foregoing has described, by way of example, a configuration where the plurality of asperities De are disposed non-uniformly on the contact surface of the contact portion CP, and where the plurality of recesses res are disposed on the surfaces of the banks Qa and Qb. This embodiment is not limited to this configuration; the plurality of asperities De need to be disposed on at least the contact surface of the contact portion CP. Nevertheless, such a configuration as described above where the plurality of protrusions pt are disposed non-uniformly is preferable so that the plurality of silver nanowires NW can be arranged with more certain so as to be partly in contact with each other. In addition, such a configuration as above where the distance between the adjacent protrusions pt is larger than the diameter of each silver nanowire NW is preferable so that the plurality of silver nanowires NW can be arranged with more certain so as to be in contact with and overlap each other.

Figure 12:
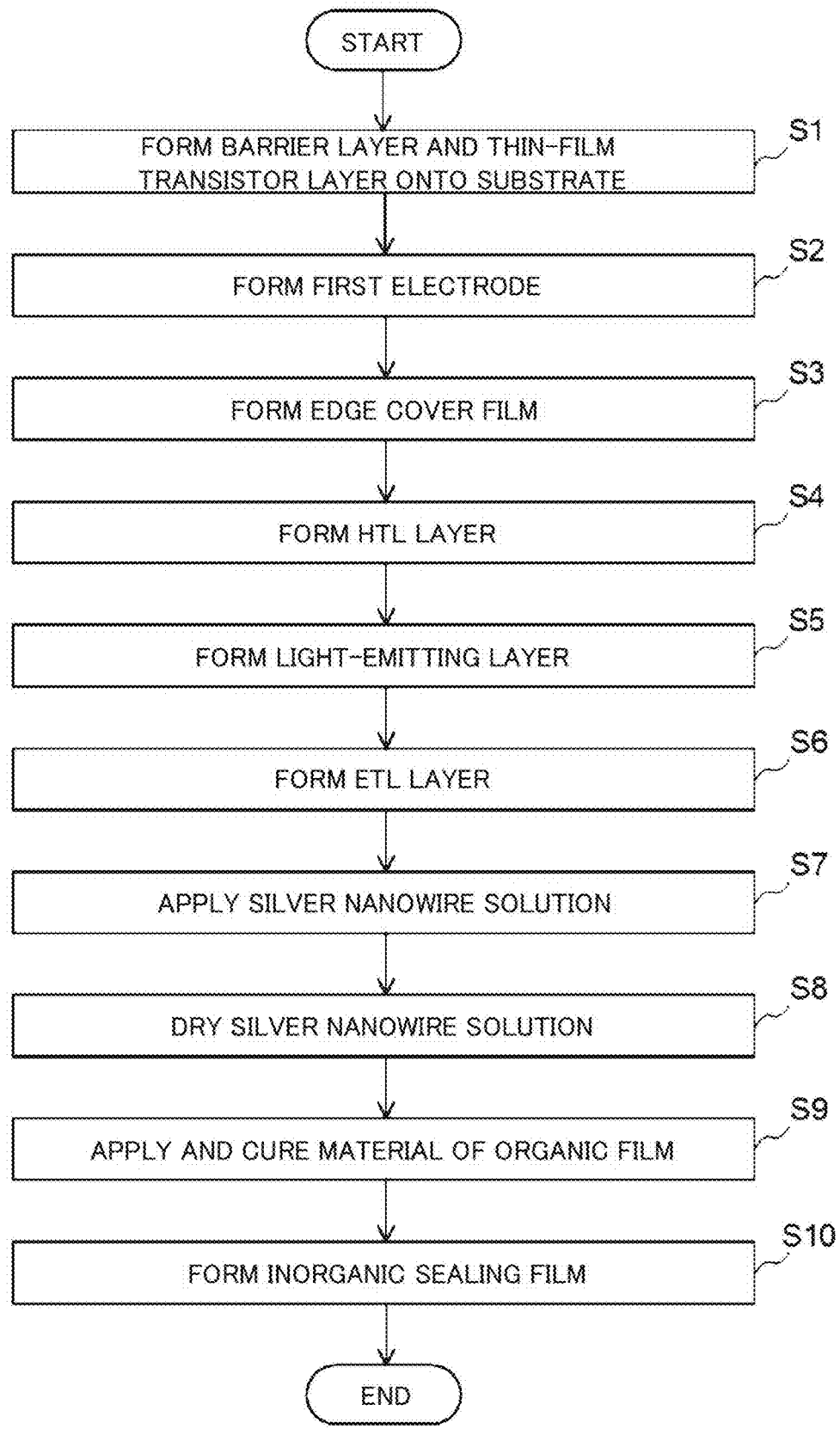
FIG. 12 is a flowchart illustrating a method for manufacturing the display device shown in FIG. 1.
Figure 13:
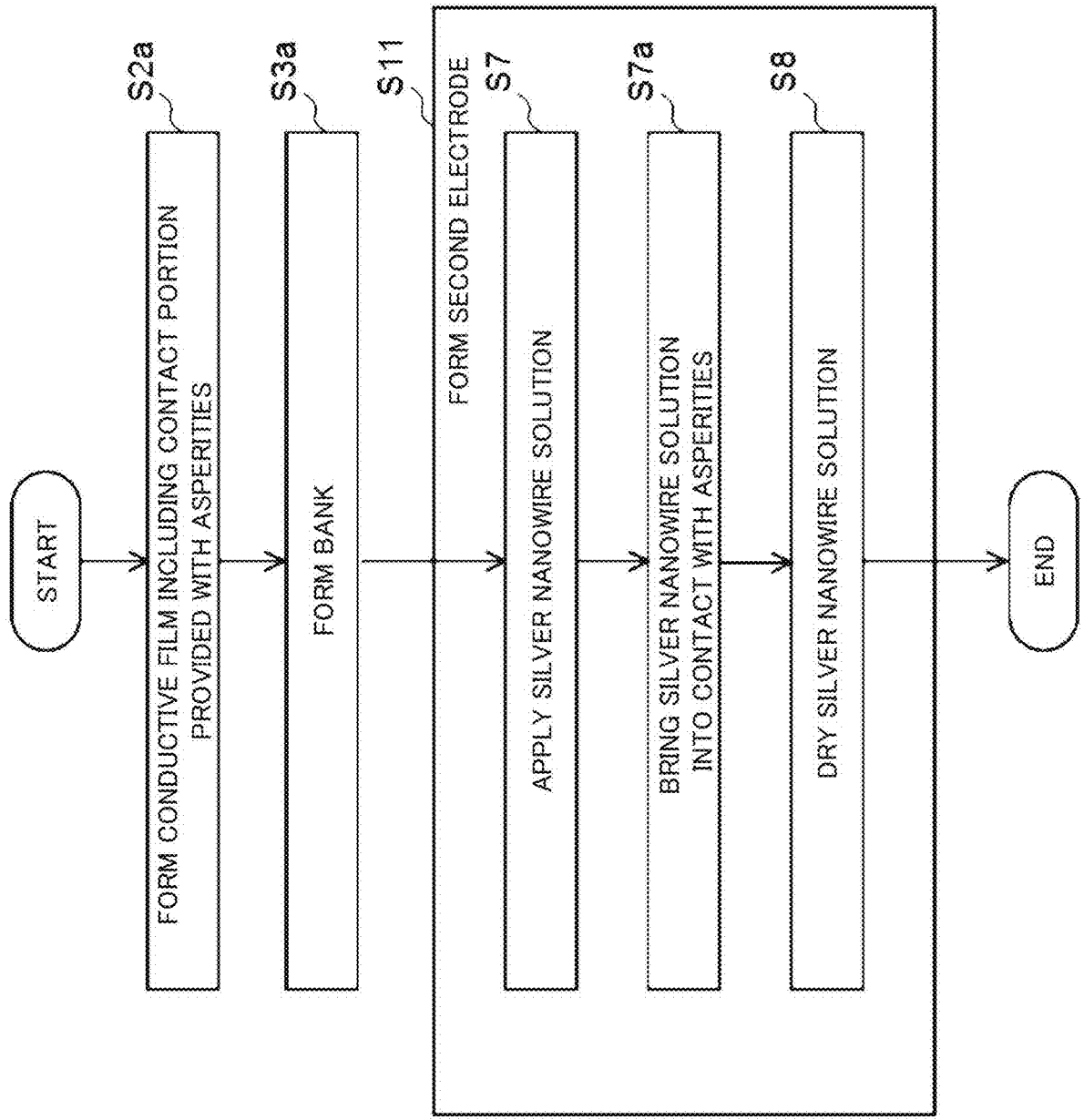
FIG. 13 is a flowchart illustrating a method for manufacturing the main components of the display device shown in FIG. 1.

With reference now to FIGS. 12 and 13, a method for manufacturing the display device 2 in this embodiment will be specifically described. FIG. 12 is a flowchart illustrating the method for manufacturing the display device shown in FIG. 1. FIG. 13 is a flowchart illustrating a method for manufacturing the main components of the display device shown in FIG. 1.

As illustrated in FIG. 12, the method for manufacturing the display device 2 in this embodiment includes Step S1, i.e., forming the barrier layer 3 and thin-film transistor layer 4 onto the base 12. The next is Step S2, i.e., forming the first electrode 22 onto the flattening film 21 through sputtering and photolithography. The next is Step S3, i.e., forming the edge cover film 23. The next is Step S4, i.e., forming the hole transport layer (HTL) 24b. The next is Step S5, i.e., forming the light-emitting layer 24c composed of, for instance, a quantum-dot light-emitting layer.

The next is Step S6, i.e., forming the electron transport layer (ETL) 24d composed of, for instance, a zinc oxide nanoparticle layer. The next is Step S7, i.e., applying a silver-nanowire solution containing the silver nanowires NW dispersed in a predetermined solvent onto the electron transport layer 24d. It some embodiments, the silver-nanowire solution may contain a binder, a dispersant, or other additives. The next is Step S8, i.e., drying the applied silver-nanowire solution (i.e., solvent removal), and forming the second electrode 25 containing the silver nanowires NW, which are in the form of a mesh as illustrated in FIGS. 4(a) and 4(b), onto the electron transport layer 24d. The next is Step S9, i.e., forming the inorganic sealing film 26 so as to cover the second electrode 25, followed by applying the material (precursor) of the organic film 27 onto the inorganic sealing film 26 through an ink-jet method and then curing the material to thus form the organic film 27. The next is Step S10, i.e., forming the inorganic sealing film 28 over the organic film 27.

The method for manufacturing the display device 2 in this embodiment includes a method for manufacturing its main components, where, for instance, the contact portion CP and second electrode 25 are formed, as illustrated in FIG. 13. To be specific, Step S2 includes Step S2a, i.e., forming the conductive film AW in the same layer as the first electrode 22 by using the same material as the first electrode 22. The formation of the conductive film AW includes forming the asperities De onto the contact surface of the contact portion CP being in contact with the silver nanowires NW, as illustrated in FIGS. 9(a) to 9(c). The asperities De are formed onto the surface of the conductive film AW in correspondence with the asperities Deh, which are formed on the surface of the flattening film 21 under the conductive film AW, and in correspondence with the plurality of island-shaped protrusions pti, which are formed on the surface of the inorganic insulating film 20 under the conductive film AW.

Next, Step S3 includes Step S3a, i.e., forming the banks Qa and Qb in the same layer as the edge cover film 23 by using the same material as the edge cover film 23. Step S3a includes forming asperities res (FIG. 10) onto the surfaces of the banks Qa and Qb through, for instance, photolithography.

The next is Step S11, i.e., forming the second electrode 25 so as to overlap the contact portion CP. Step S11 includes Steps S7 and S8. Step S11 also includes Step S7a, i.e., bringing the silver-nanowire solution into contact with the asperities De at the contact portion CP to thus bring the plurality of silver nanowires NW, contained in the silver-nanowire solution, into contact with each other so as to overlap each other on the asperities De, as illustrated in FIG. 11(b). Here, Step S7a is performed between Steps S7 and S8.

The display device 2 can be manufactured through the foregoing process steps.

As described above, the display device 2 in this embodiment is configured such that the frame region NA includes the banks Qa and Qb surrounding the display region DA and defining the end of the second electrode 25. Here, each of the banks Qa and Qb is provided in the form of a frame. In this configuration, disposed closer to the display region DA than the banks Qa and Qb is the conductive film AW electrically connecting together the terminal section TA and second electrode 25. The conductive film AW includes the contact portion CP being in contact with the silver nanowires NW (metal nanowires) contained in the second electrode 25. Also in this configuration, the contact portion CP has the plurality of asperities De disposed on its surface being in contact with the silver nanowires NW. The forgoing configuration can thus avoid the plurality of silver nanowires NW from being arranged in parallel with each other at a site on the contact portion CP, thereby avoiding a local increase in the electrical resistance of the second electrode 25 at the site. The configuration in this embodiment consequently offers the display device 2 that can avoid a local increase in the electrical resistance of the second electrode 25 and has high display quality, and the configuration also offers a method for manufacturing the display device 2.

The second electrode 25 in this embodiment, which is formed through application and drying of a silver-nanowire solution, less affects the light-emitting layer 24c (e.g., a quantum-dot light-emitting layer) than the second electrode 25 that is formed through sputtering or evaporation. The display device 2 in this embodiment can consequently avoid degradation in its light emission property.

The second electrode 25 containing the silver nanowires NW, which is more flexible than a typical second electrode, such as a Ag thin film, is suitable as the common electrode of the display device 2 that is flexible.

Second Embodiment

Figure 14:
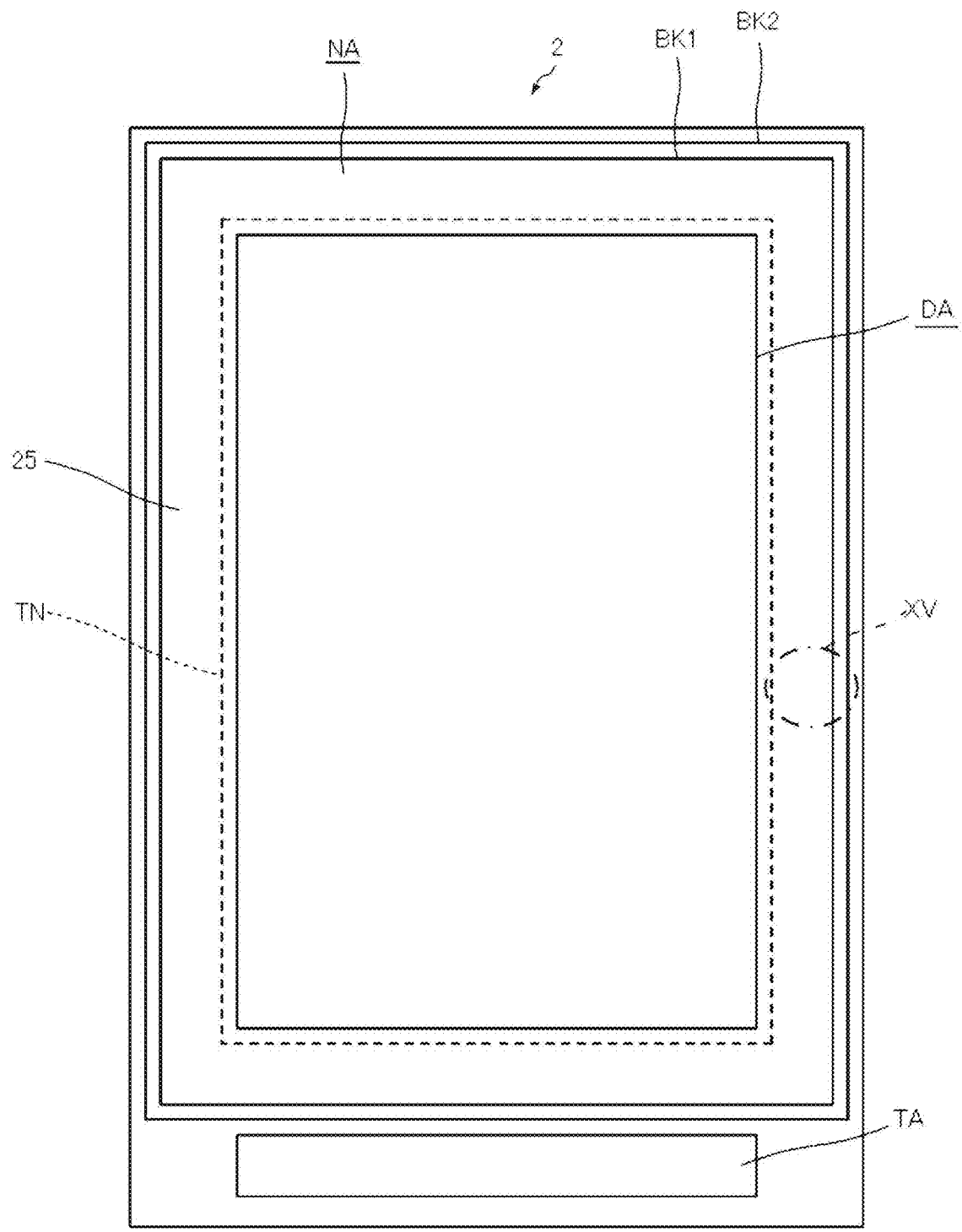
FIG. 14 is a plan view of main components of a display device according to a second embodiment of the disclosure.
Figure 15:
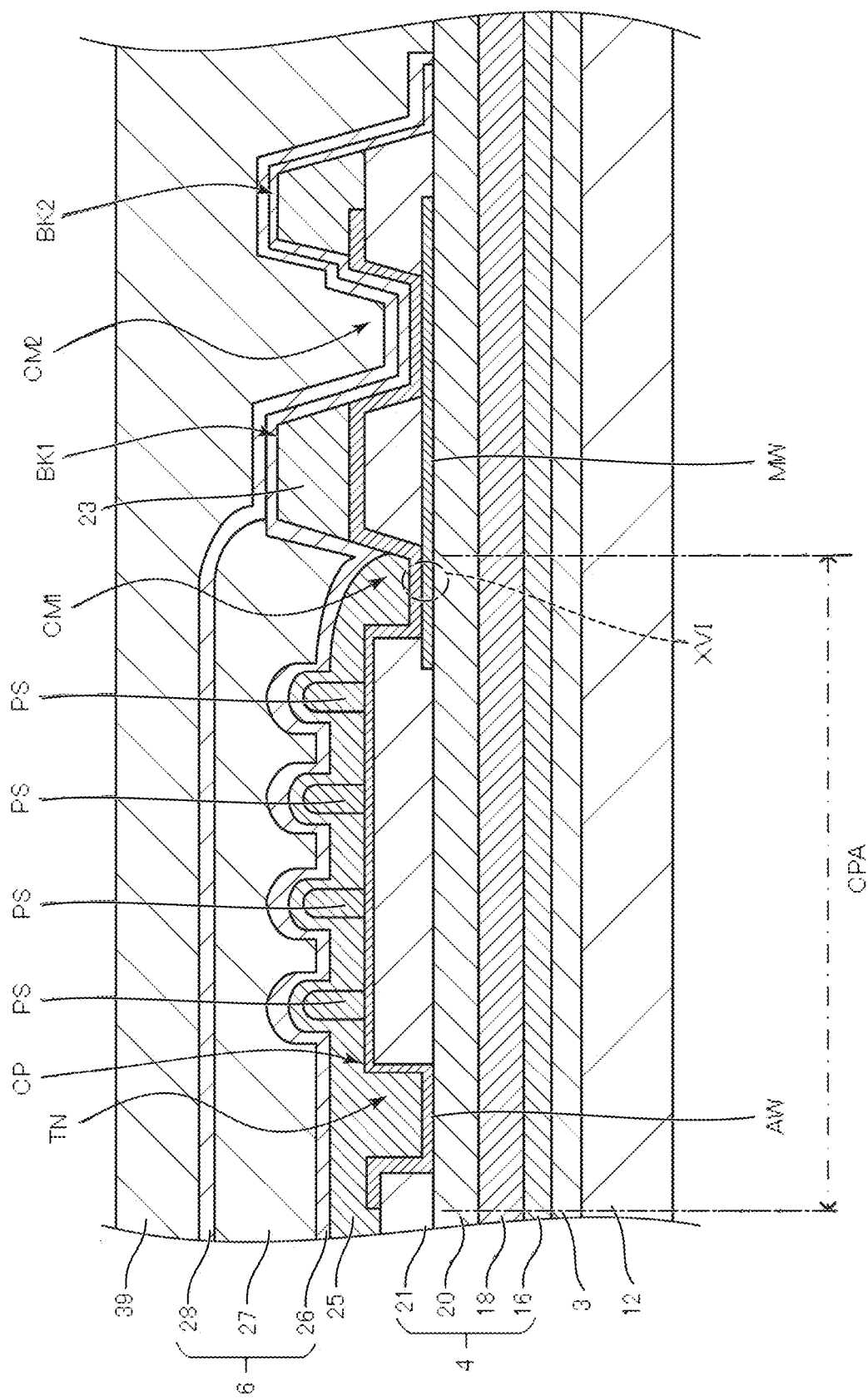
FIG. 15 is a sectional view of the main components in a region defined by XV in FIG. 14.
Figure 16:
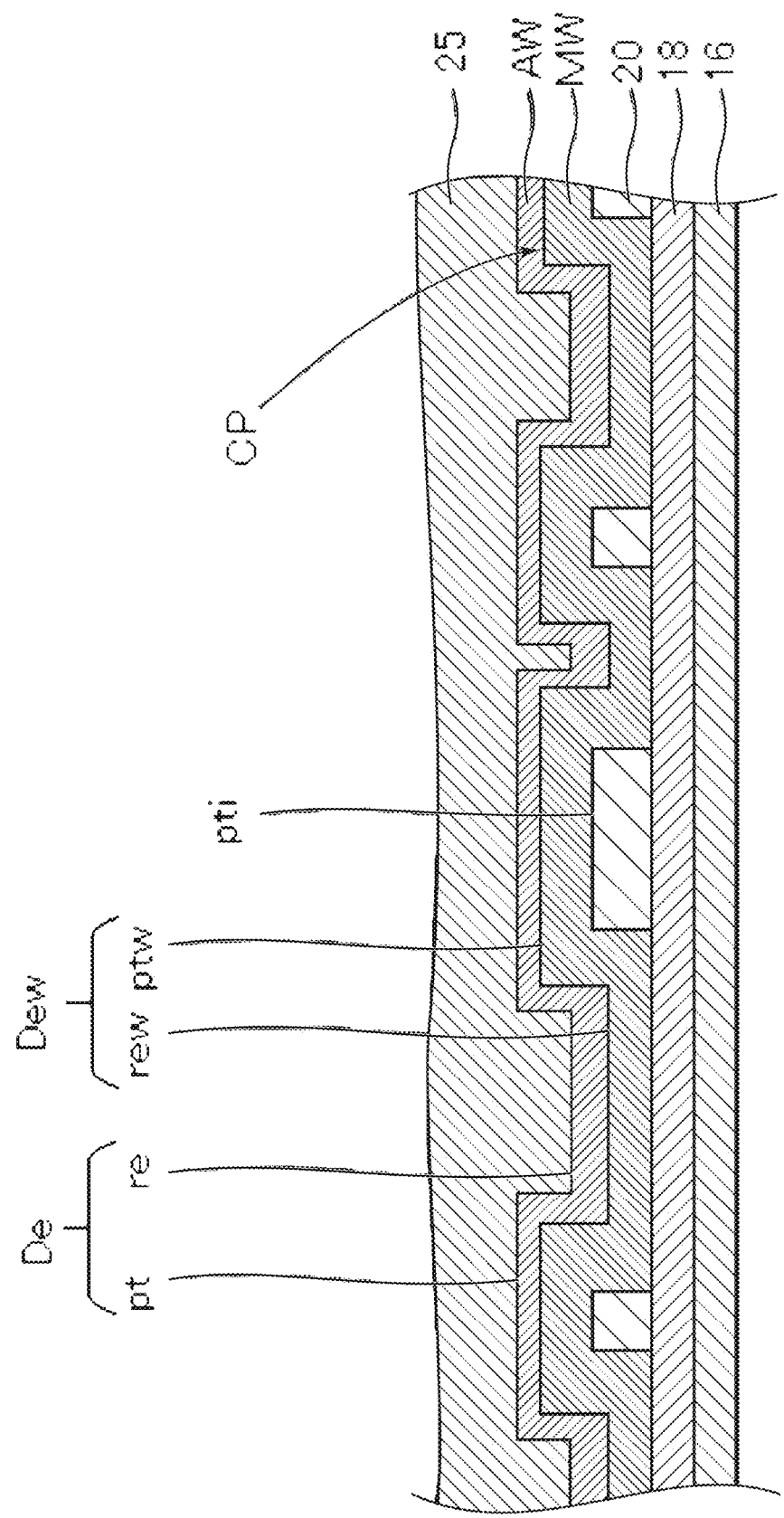
FIG. 16 is an enlarged sectional view of a specific configuration in a region defined by XVI in FIG. 15.

FIG. 14 is a plan view of main components of a display device according to a second embodiment of the disclosure. FIG. 15 is a sectional view of the main components in a region defined by XV in FIG. 14. FIG. 16 is an enlarged sectional view of a specific configuration in a region defined by XVI in FIG. 15.

A main difference between the drawings relating to this embodiment and the drawings relating to the first embodiment lies in that the sealing bank BK1 functions as the banks Qa and Qb. Hereinafter, components that are used in common to those in the first embodiment will be denoted by the same signs, and the description of their redundancies will be omitted.

As illustrated in FIG. 14, the trench TN of the display device 2 in this embodiment is provided in the form of a frame surrounding the entire perimeter of the display region DA. In addition, the sealing bank BK1 surrounds the trench TN. The sealing bank BK1 functions as the banks Qa and Qb and defines the end of the second electrode 25 as well as the end of the organic film 27, as illustrated in FIG. 15. As denoted by a dot-dashed bidirectional arrow CPA in FIG. 15, the contact portion CP in this embodiment is disposed in a region between the end of the conductive film AW close to the display region DA and the sealing bank BK1, i.e., a region in which the second electrode 25 is disposed. In this embodiment, the photo-spacers PS are provided instead of the banks Qa and Qb. Furthermore in this embodiment, the contact groove CM1 has, on the exposed surface of the conductive film AW as well, the asperities De being in contact with the silver nanowires NW.

To be specific, the contact portion CP in this embodiment has the asperities De disposed on the conductive film AW on the flattening film 21 and inorganic insulating film 20, like the contact portion CP in the first embodiment. Furthermore as illustrated in FIG. 16, at the contact portion CP in this embodiment, the asperities De of the contact portion CP are formed, on the conductive film AW located on the power-source trunk wire MW, following asperities Dew of the power-source trunk wire MW. That is, the power-source trunk wire MW between the conductive film AW and inorganic insulating film 20 at the contact portion CP has, on its surface close to the conductive film AW, the plurality of asperities Dew, i.e., a plurality of protrusions ptw disposed non-uniformly and a plurality of recesses rew disposed between the protrusions ptw adjacent to each other. The asperities Dew are formed following the plurality of island-shaped protrusions pti of the inorganic insulating film 20, and on the contact surface of the contact portion CP, the asperities De are formed following the plurality of island-shaped protrusions pti and the asperities Dew. To be more specific, the protrusions ptw of the asperities Dew of the power-source trunk wire MW are formed following the protrusions pti of the inorganic insulating film 20, and the recesses rew are formed between the adjacent protrusions ptw.

The foregoing configuration in this embodiment achieves an action and effect similar to that in the first embodiment.

Third Embodiment

Figure 17:
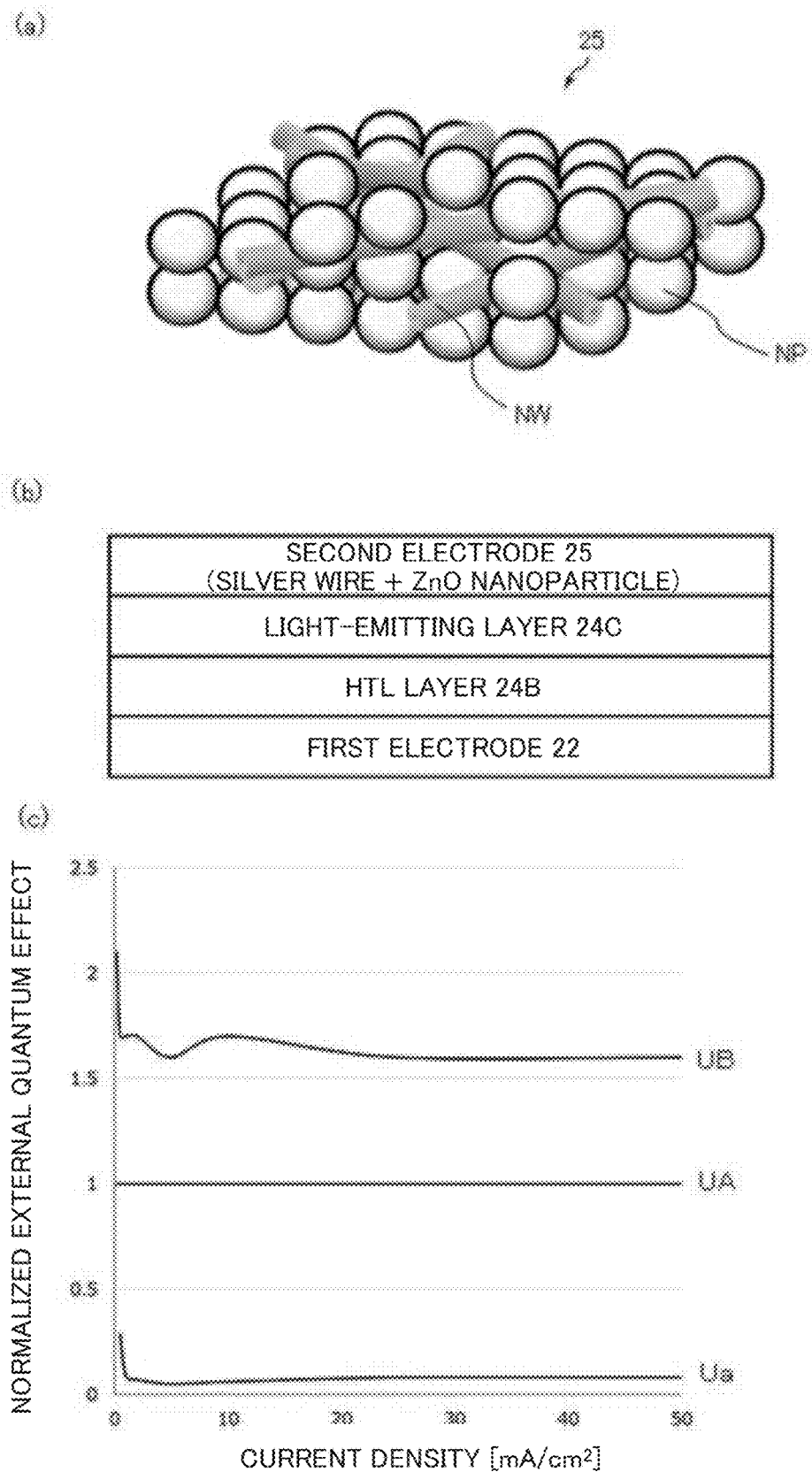
FIG. 17(*a*) is a perspective view of a specific configuration of a second electrode included in a display device according to a third embodiment of the disclosure.

FIG. 17 (*a*) is a perspective view of a specific configuration of a second electrode included in a display device according to a third embodiment of the disclosure. FIG. 17 (*b*) illustrates a specific configuration of a light emitter layer included in the display device according to the third embodiment of the disclosure. FIG. 17 (*c*) is a graph showing an effect of the display device according to the third embodiment of the disclosure.

A main difference between the drawings relating to this embodiment and the drawings relating to the first embodiment lies in that the second electrode 25 includes an electron transport layer. Hereinafter, components that are used in common to those in the first embodiment will be denoted by the same signs, and the description of their redundancies will be omitted.

As illustrated in FIG. 17(*a*), the second electrode 25 of the display device 2 in this embodiment contains the silver nanowires NW and contains zinc oxide (ZnO) nanoparticles NP, which are an electron transport material. That is, the second electrode 25 with the silver nanowires NW and zinc oxide nanoparticles NP mixed together is obtained through application and drying of a mixed solution consisting of a silver nanowire solution and zinc oxide nanoparticle solution mixed together at a desired ratio and stirred together. To be specific, the silver nanowires NW are disposed non-uniformly and three-dimensionally, and the silver nanowires NW pass through the gaps between the zinc oxide nanoparticles NP (an average particle diameter of 1 to 30 nm).

As illustrated in FIG. 17(*b*), the display device 2 in this embodiment has the following stacked sequentially: the first electrode 22 (anode); the HTL (hole transport layer) 24*b*; the light-emitting layer 24*c* (e.g., a quantum-dot light-emitting layer); and the second electrode (common cathode) 25 including the electron transport layer.

The configuration in FIG. 17(*a*) includes the second electrode 25 having an increased area of contact between the silver nanowire NW and the zinc oxide nanoparticle NP, which is an electron transport material. Thus, the graph in FIG. 17(*c*) demonstrates that at a current density ranging from 0 to 50 mA/cm$^2$, the external quantum effect (a normalized value with respect to a reference value), UB, of the light emitter X in this embodiment improves to a greater degree than the configuration in FIG. 3, i.e., the external quantum effect (a reference vale of 1 at an individual current density), UA, of the light emitter X having the second electrode 25 stacked on the electron transport layer (zinc oxide nanoparticle layer) 24*e*, and to a greater degree than the normalized external quantum efficiency (a normalized value with respect to a reference value), of a typical light emitter having a silver thin-film cathode.

The configuration in this embodiment can reduce the number of process steps when compared to a configuration where the electron transport layer 24*e* and the second electrode (common cathode) 25 are formed in different process steps.

Too many metal nanowires NW lower the capability of electron transport to the light-emitting layer 24*c*, whereas too few metal nanowires NW increase resistance. Accordingly, the ratio of volume of the metal nanowires NW to the ZnO nanoparticles NP is $1/49$ to $1/9$. This volume ratio is applied also to oxide nanoparticles, which will be described later on.

In some embodiments, an electron injection layer (EIL) or a hole injection layer (HIL) may be provided other than the foregoing description. That is, a hole injection layer may be placed between the anode and hole transport layer, or an electron injection layer may be placed between the cathode and electron transport layer. Furthermore, an integrated layer composed of a hole transport-and-injection layer may be used, or an integrated layer composed of an electron transport-and-injection layer may be used; alternatively, an electron blocking layer or a hole blocking layer may be placed as appropriate.

The foregoing embodiments have described, by way of example, a display device that includes a first electrode serving as an anode, and a second electrode serving as a cathode. The disclosure is also applicable to a display device that includes a light emitter layer having an inverted stacked structure, i.e., a first electrode serving as a cathode and a second electrode serving as an anode. That is, the disclosure may encompass an inverted structure having a substrate on which for instance, a cathode, an electron injection layer, an electron transport layer, a light-emitting layer, a hole transport layer, a hole injection layer, and an anode are stacked sequentially.

The foregoing embodiments have described, by way of example, the protrusions pt each having a square shape in a plan view, as illustrated in FIG. 9(*a*). In some embodiments, each protrusion pt may have any of a circular, elliptical, distorted elliptical, quadrangular and other polygonal shapes in a plan view or may have a polygonal shape having rounded corners. In addition, different protrusions pt may have different sizes and shapes, or the plurality of protrusions pt may be placed irregularly.

The foregoing embodiments have described, by way of example, an electron transport layer composed of a zinc oxide nanoparticle (ZnO nanoparticle) layer. In some embodiments, an electron transport layer can be used that is composed of other kinds of oxide nanoparticles, such as magnesium zinc oxide (MgZnO) nanoparticles.

INDUSTRIAL APPLICABILITY

The disclosure is useful for a display device that can avoid a local increase in the electrical resistance of its second electrode and has high display quality, and the disclosure is useful for a method for manufacturing such a display device.

The invention claimed is:

1. A display device comprising:
    a display region;
    a frame region surrounding the display region and including a terminal section;
    a thin-film transistor layer; and
    a light emitter layer including a plurality of light emitters each having a first electrode, a light-emitting layer, and a second electrode, the plurality of light emitters being configured to emit mutually different colors of light,
    wherein the second electrode is shared among the plurality of light emitters and contains a metal nanowire,
    the frame region includes a bank having a frame shape surrounding the display region and defining an end of the second electrode,
    a conductive film is disposed closer to the display region than the bank is, the conductive film electrically connecting together the terminal section and the second electrode,
    the conductive film includes a contact portion being in contact with the metal nanowire, and
    the contact portion has a plurality of asperities disposed on a contact surface being in contact with the metal nanowire.

2. The display device according to claim 1, wherein
    the thin-film transistor layer includes an inorganic insulating film disposed under the conductive film,
    the inorganic insulating film has a plurality of island-shaped protrusions, and
    the plurality of asperities of the contact portion are disposed following the plurality of island-shaped protrusions of the inorganic insulating film.

3. The display device according to claim 2, further comprising
    a power-source trunk wire disposed between the conductive film and the inorganic insulating film,
    wherein the power-source trunk wire has a plurality of asperities,
    the plurality of asperities of the power-source trunk wire are disposed following the plurality of island-shaped protrusions of the inorganic insulating film, and
    the plurality of asperities of the contact portion are disposed following the plurality of asperities of the power-source trunk wire.

4. The display device according to claim 1, wherein
    the thin-film transistor layer includes a flattening film disposed under the conductive film,
    the flattening film has a plurality of asperities, and
    the plurality of asperities of the contact portion are disposed following the plurality of asperities of the flattening film.

5. The display device according to claim 4, wherein
    the frame region includes
    the flattening film having a trench disposed closer to the display region than the bank is, and
    the contact portion covering the trench.

6. The display device according to claim 5, wherein the trench has a frame shape surrounding an entire perimeter of the display region.

7. The display device according to claim 5, wherein
    the terminal section includes a plurality of terminals disposed along one of four sides of the display region, and
    the trench surrounds a part of the one side and all remaining three of the four sides of the display region.

8. The display device according to claim 7, wherein the metal nanowire is shorter than a distance between the plurality of terminals adjacent to each other.

9. The display device according to claim 1, further comprising:
    a sealing layer including an organic film and sealing the light emitter layer; and
    a sealing bank having a frame shape surrounding the bank, the sealing bank defining an end of the organic film.

10. The display device according to claim 9, wherein a photo-spacer is disposed between the bank and the sealing bank in a plan view.

11. The display device according to claim 10, wherein the bank is thinner than the photo-spacer.

12. The display device according to claim 1, wherein the bank is a sealing bank defining the end of an organic film.

13. The display device according to claim 1, wherein
    the light emitter layer includes an edge cover film covering an edge of the first electrode,
    the bank is disposed in a layer identical to a layer where the edge cover film is disposed, and
    the bank is made of a material identical to a material of the edge cover film.

14. The display device according to claim 1, wherein the bank has a surface provided with a plurality of recesses.

15. The display device according to claim 1, wherein
    the conductive film is disposed in a layer identical to a layer where the first electrode is disposed, and
    the conductive film is made of a material identical to a material of the first electrode.

16. The display device according to claim 1, wherein the light-emitting layer is a quantum-dot light-emitting layer.

17. The display device according to claim 1, wherein the second electrode has a light transmittancy of 80% or more.

18. The display device according to claim 1, wherein the metal nanowire contains at least one of Ag, Au, Al and Cu.

19. The display device according to claim 1, wherein
    the first electrode is an anode,
    the second electrode is a cathode, and
    the second electrode contains an electron transport material.

20. The display device according to claim 19, wherein the second electrode is in contact with the light-emitting layer.

* * * * *